(12) United States Patent
Imai et al.

(10) Patent No.: US 7,026,180 B2
(45) Date of Patent: Apr. 11, 2006

(54) SCREEN-PRINTING METAL MASK PLATE AND METHOD OF RESIN-SEALING VIBRATING PART

(75) Inventors: Kazuo Imai, Toyama (JP); Isamu Saito, Toyama (JP); Yoshiaki Yamaguchi, Toyama (JP); Naomi Nakayama, Toyama (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 11/083,253

(22) Filed: Mar. 17, 2005

(65) Prior Publication Data

US 2005/0208709 A1 Sep. 22, 2005

(30) Foreign Application Priority Data

| Mar. 19, 2004 | (JP) | ............................ P2004-081038 |
| Apr. 6, 2004 | (JP) | ............................ P2004-111771 |
| Apr. 6, 2004 | (JP) | ............................ P2004-112500 |

(51) Int. Cl.
*H01L 21/00* (2006.01)
*B28B 1/00* (2006.01)

(52) U.S. Cl. .................. 438/26; 438/126; 438/127; 425/175

(58) Field of Classification Search ............... 438/26, 438/126, 127; 425/175
See application file for complete search history.

(56) References Cited

U.S. PATENT DOCUMENTS 6,326,240 B1 * 12/2001 Liaw ........................ 438/113
6,740,543 B1 * 5/2004 Rutiser ...................... 438/112
6,745,462 B1 * 6/2004 Rutiser ...................... 29/841
6,805,541 B1 * 10/2004 Hashimoto ................ 425/110
2002/0025601 A1 * 2/2002 Liaw ........................ 438/106
2004/0180472 A1 * 9/2004 Chen et al. ................ 438/112
2005/0250246 A1 * 11/2005 Ogasawara et al. ........ 438/106

FOREIGN PATENT DOCUMENTS

| JP | 1-270325 | * 10/1989 |
| JP | 3-6731 | 1/1991 |
| JP | 5-53715 | 3/1993 |
| JP | 6-95594 | 11/1994 |
| JP | 3128612 | 11/2000 |
| JP | 2003-122507 | 4/2003 |

* cited by examiner

*Primary Examiner*—Evan Pert
(74) *Attorney, Agent, or Firm*—Pearne & Gordon LLP

(57) ABSTRACT

A squeegee is slid over a metal mask plate so as to fill a sealing resin in a resin inflow space through a through hole, and the sealing resin, deposited on an outer surface of an electronic part that includes a vibrating part, is thermally set. A through hole that corresponds to an electronic part is formed in a metal mask plate. The through hole includes a lower smaller through hole and an upper larger through hole communicating with an upper side of the lower smaller through hole, and a step portion is formed within the through hole. A relief recess is provided in a region of a metal mask plate including at least a projected region in which an operating area is projected onto a surface of the metal mask plate opposing the touch panel in a state in which the metal mask plate covers the touch panel.

8 Claims, 24 Drawing Sheets

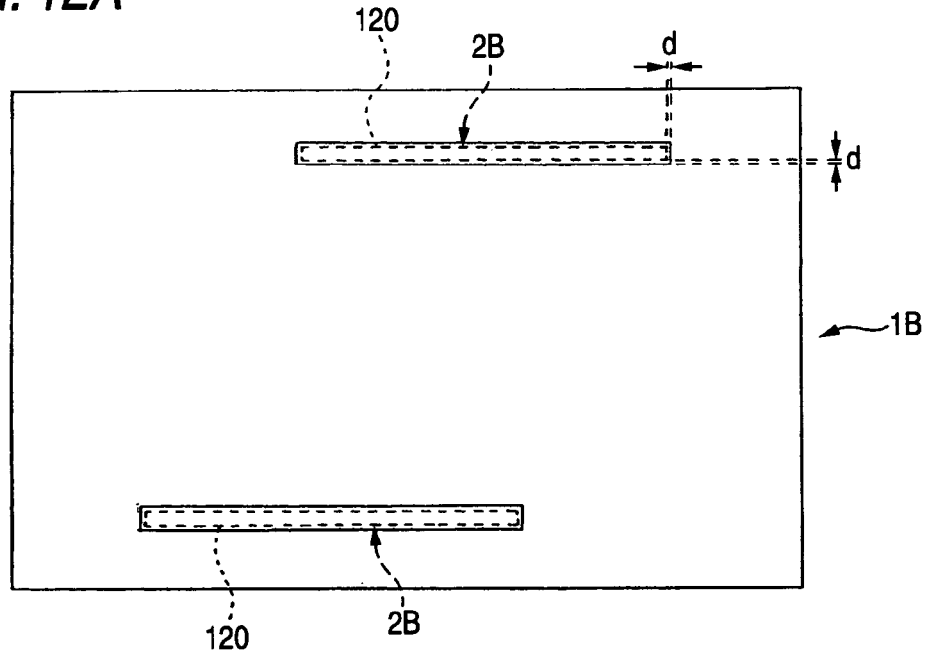
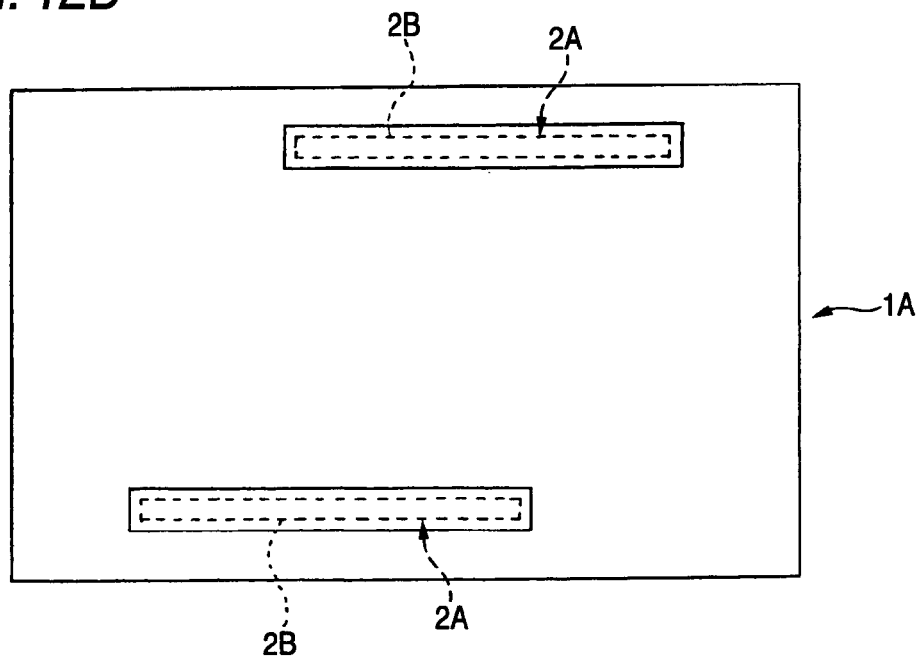

SCREEN-PRINTING METAL MASK PLATE AND METHOD OF RESIN-SEALING VIBRATING PART

BACKGROUND OF THE INVENTION

This invention relates to a method of resin-sealing an electric part that includes a vibrating part, in which the vibrating part (serving as a vibration source for producing a push operating feeling), which is fixedly secured to a touch panel, is sealed at its outer surface with a resin.

And this invention relates to a screen-printing metal mask plate used for resin-sealing the outer surface of the electronic part, mounted on a board, by screen-printing.

Moreover, the present invention concerns a metal mask plate used for resin sealing an electronic part mounted in a periphery of a transparent operating area of a touch panel.

A touch panel input device is also called a digitizer, in which when an operating area, provided on a touch panel, is pushed or operated by a stylus pen or a finger, the pushed position within this operating area is detected, and input position data, representing the pushed position, is outputted to a processing apparatus such as a personal computer.

There are known various touch panel input devices which are classified into the contact type (as disclosed in JP-UM-A-3-6731), the resistance type ((as disclosed in JP-A-5-53715) and others, depending on a method of detecting a pushed position. In any of these types, when a pushing operation was effected, a clear pushing operation feeling, such as a click feeling obtained in a push button switch, was not obtained, and therefore the operator could know the results of the operation only through the processing apparatus such as a personal computer, and therefore the operator was anxious about whether or not the pushing operation on the operating panel was recognized.

Therefore, the present Applicant has developed a touch panel input device in which piezoelectric plates serving as vibrating parts are fixedly secured to a touch panel so as to efficiently vibrate the touch panel without forming the whole of the device into a large size, thereby transmitting a pushing operation feeling to the operator (see Patent Literature 1).

Patent Literature 1: JP-A-2003-122507 Publication (Abstract, FIG. 1)

An electronic part (such as a piezoelectric substrate), mounted on a board such as a touch panel, has electrodes (such as drive electrodes) exposed to a surface thereof, and therefore is susceptible to aged deterioration by oxidation, sulfurization or the like. And besides, there is a fear that the short-circuiting develops between the electrodes and also between the electronic part and other conducting part, and therefore generally, the whole of the electronic part is sealed with an insulative resin.

As a related resin-sealing method of sealing an electronic part with a resin, there are known a sealing method, employing a dispenser, and a screen-printing method employing a metal mask plate (see Patent Literature 2 and 3).

Patent Literature 2: JP-B-6-95594 Publication (Page 3, FIG. 2)

Patent Literature 3: Japanese Patent No. 3128612 (Page 2, FIG. 9)

In the former sealing method employing the dispenser, a sealing resin 214 is extruded by the use of a pneumatically-operated dispenser 205, and is coated on an electronic part 220 (which is to be sealed) to completely cover an entire outer surface thereof as shown in FIG. 9, and thereafter a panel, having the electronic part 220 mounted thereon, is passed through a heating surface, so that the sealing resin is thermally set or cured, and is fixed to the outer surface of the electronic part 220 to seal the same.

In the latter method, that is, the screen-printing method, a sealing resin is deposited on an outer surface of an electronic part as if the sealing resin were ink in the screen-printing. As shown in FIG. 10 and 25, a support base plate 202 (302), having the electronic part 220 (320) mounted thereon, is covered with the metal mask plate 212 (303) having a through hole 211 (305) which is slightly larger and deeper than a contour of the electronic part 220 (320) formed therein by etching or the like, and a squeegee 213 (304) is slid over the surface of the metal mask plate 212 (303), thereby filling the sealing resin 214 (306) in a gap between the through hole 211 (305) and the electronic part 220 (320).

Thereafter, the metal mask plate 212 (303) is removed, the sealing resin 214 (306), deposited on the outer surface of the electronic part 220 (320), is thermally set as in the former method, so that the sealing resin 214 (306) is fixed to the outer surface of the electronic part 220 (320) to seal the same.

In the sealing method using the dispenser, the sealing resin 214 need to be extruded through a narrow nozzle, and therefore the sealing resin 214 is limited to a low-viscosity type. When this sealing resin was coated on the surface of the electronic part 220, the coated sealing resin could not retain its shape until it was thermally set, and therefore in the case where there is used the plate-like electronic part such as the piezoelectric substrate, edge portions thereof were exposed, thus inviting a problem that the electronic part 220 could not be completely sealed. And besides, the process of completely depositing the sealing resin on the entire outer surface of each single electronic part 220 was complicated, and it was difficult to automate this process.

In the screen-printing method, the metal mask plate 212 (303) can be reused, and all of the electronic parts to be fixed to the supporting board (the touch panel) 202 (302) can be simultaneously resin-sealed, and therefore this method is suited for mass-production, and besides since the process is simple, this method is suited for automation. However, when using this method in an unchanged manner as means for resin-sealing the electronic part (the vibrating part such as the piezoelectric substrate) of the touch panel input device, there have been encountered-the following problems.

As shown in FIG. 25, the piezoelectric substrates (that include the vibrating parts) 320 to be fixed to the touch panel 302 are fixed to a region between the periphery of the operating area 300A and the peripheral edge of the touch panel 302 so that these piezoelectric substrates 320 will not hinder the detection of a pushed position. In order that a pushing operation can be easily effected for the touch panel 302 having a limited size to meet the requirements for a mounting space, a compact design, etc., (and that a display, disposed internally of the operating area 300A, can be more clearly seen through the operating area 300A in the case where the operating area 300A is transparent), it is required to provide the enlarged operating area 300A, so that each piezoelectric substrate 320 is fixedly mounted on a region of a much limited width. On the other hand, the piezoelectric substrate 320 that has as large a size as possible within the limited mounting width are used in order to more effectively produce large vibrations. As a result, a distance d2 between the piezoelectric substrate 320 and the operating area 300A was as small as about 0.5 mm when the piezoelectric substrate 320 with a width of 2 mm was mounted on the touch panel.

A relatively-sufficient mounting space for the piezoelectric substrates 320 may, in some cases, be available, and even in such a case, when a coating of the sealing resin 306, sealing the piezoelectric substrate 320, is thick, the sealing resin 306 restrains the piezoelectric substrate 320 from vibrating, so that the piezoelectric substrate 320 fails to effectively serve as the vibration-generating source, and therefore it is necessary to reduce the thickness of the sealing resin.

In the case of resin-sealing the piezoelectric substrates 320 by the use of the screen-printing method, it is necessary that the small distance d2 should be substantially equal to a lower thickness limit of the sealing resin 306.

On the other hand, it is also necessary to cover at least the flat surface of the piezoelectric substrate 320 with the sealing resin 306, and therefore the height or depth of the through hole 305 should be set to a value (for example, 1 mm) larger than the height of the piezoelectric substrate 320. Therefore, even when trying to fill the sealing resin 306 in this gap by the use of the squeegee 304, there was encountered a problem that the sealing resin 306 could not be fully filled in this narrow deep gap to thus fail to reach the touch panel 302, so that the whole of the piezoelectric substrate 320 could not be completely sealed.

With respect to this problem, when the sealing resin 306 of a low viscosity is used, and is filled into this gap while increasing the pressure of inflow of the resin (i.e., the pressure of filling) by the squeegee 304, the sealing resin 306 reaches the touch panel 302. However, when thus filling the sealing resin 306 while increasing the pressure of inflow of the resin by the squeegee 304, even the sealing resin 306 to be deposited on the flat surface (upper surface) of the piezoelectric substrate 320 was wiped off, so that part of the flat surface was exposed. And besides, when the viscosity of the sealing resin 306 was lowered, there was encountered a problem that the sealing resin, deposited on the surface of the piezoelectric substrate 320, could not retain its shape until the sealing resin was thermally set by the heating furnace, and therefore the deposited sealing resin flowed to be deposited on the operating area 300A, and the edge portions thereof were exposed, so that the complete sealing could not be achieved.

And in this related resin-sealing method, the sealing resin 306 is filled in the through hole 305 by the use of the squeegee 304, and therefore a material with fluidity and viscosity is used as the sealing resin 306. Therefore, when the metal mask plate 303 is removed from the periphery of the electronic part 320, part of the sealing resin 306, deposited on an edge portion of the electronic part 320, adheres to an inner surface of the through hole 305, and is pulled as shown in FIG. 26. The metal mask plate 303 is completely separated from the electronic part, and the sealing resin is thermally set as shown in FIG. 27, and in this condition a horn-like projection 307, resulting from the residual sealing resin 306, is formed at the edge portion of the electronic part 320.

As a result, the appearance was degraded, and besides the horn-like projection 307 abutted against other parts, and prevented a high-density mounting design, and could cause incomplete insulation and contact.

Particularly in a touch panel input device in which a display panel, such as liquid crystal display elements, is provided in a stacked manner on a rear side of a transparent touch panel, when a horn-like projection 307 is formed on a piezoelectric substrate (fixed to the rear surface of the touch panel so as to vibrate this touch panel), the horn-like projection 307 abuts against the display panel, so that the display panel can not be disposed in proximity to the touch panel, and therefore the display panel can not be viewed clearly.

And besides, when the horn-like projection 307 abuts against the display panel, the vibration of the piezoelectric substrate is restrained, which has invited a problem that the touch panel cannot be vibrated at sufficient amplitude.

Moreover, with this related metal mask plate 303, when the board 302 is covered with the metal mask plate 303, and the sealing resin 306 is filled into the gap around the electronic part 320, the metal mask plate 303 and the board 302 cannot be completely brought into contact with each other. Therefore, there have been cases in which, as shown in FIG. 28, part 306a of the sealing resin 306 which leaked into a gap between the metal mask plate 303 and the board 302 remains along the surface of the board 302.

Particularly in a case where a transparent operating area 300A is set in the touch panel 302 of a touch panel input device to permit input operation while viewing a display on a display unit disposed inwardly of the touch panel 302, and the electronic parts 320 mounted on a periphery of the operating area 300A on the board, i.e., the touch panel 302, are resin sealed, there has been a problem in that the part 306a of the sealing resin 306 leaking along the touch panel 302 adheres on the operating area 300A, making it difficult to view the display on the display unit.

This phenomenon appears frequently and more noticeably, since the position where the electronic part 320 is mounted and the operating area 300A are close together, and the sealing resin 306 is inevitably filled by increasing the filling pressure when the sealing resin 306 is thoroughly filled in a narrow gap d2 between the through hole 305 and the electronic part 320. Consequently, the part 306a of the sealing resin 306 comes to adhere to the operating area 300A that is close.

In addition, since the metal mask plate 303 is used repeatedly at the time of mass producing touch panel input devices 300, there has occurred a problem in that the sealing resin 306 used in the screen-printing process and other dust remain by adhering to the surface of the metal mask plate 303 opposing the touch panel 302, and adhere to the region of the operating area 300A at the time of covering a new touch panel 302, thereby impairing transparency.

SUMMARY OF THE INVENTION

This invention has been made in view of the above problems of the related techniques, and an object of this invention is to provide a method of resin-sealing an electronic part that includes a vibrating part, which is suited for mass production, and is capable of completely covering the vibrating part with a thin coating of a sealing resin, and to provide a screen-printing metal mask plate by which a horn-like projection is less liable to be formed on an electronic part even when the electric part is resin-sealed at its outer surface by screen-printing, and a metal mask plate in which the sealing resin does not leak to the operating area even in the case of resin sealing the-electronic part mounted on-the-periphery of the transparent operating area of the touch panel.

Another object of the invention is to provide a metal mask plate that does not impair the transparency of the operating area even if the metal mask plate is used repeatedly in the resin sealing of electronic parts.

In order to accomplish the above object, the invention is characterized by having the following arrangement:

(1) A method of resin-sealing a vibrating part of a touch panel input device that includes an operating panel that has an operating area, a touch panel that supports the operating panel, and a vibrating part that is fixed to a portion of the touch panel, which corresponds to a periphery of the operating area, in which an inputting operation is inputted onto the operating area so that the operating panel is vibrated by the vibrating part so as to generate a feeling of the inputting operation, the method comprising:
providing the touch panel that includes the vibrating part;
disposing a metal mask plate, which includes a through hole that accommodates the vibrating part, and is formed at a portion corresponding to the vibrating part, so as to form a resin inflow space between the vibrating part and the through hole, onto a surface of the touch panel, on which the vibrating part is mounted;
sliding a squeegee over the metal mask plate, so as to fill a sealing resin, which has thixotropic properties, thermosetting properties and insulating properties, in the resin inflow space through the through-hole;
removing the metal mask plate from the touch panel; and
thermally setting the sealing resin that is deposited on an outer surface of the vibrating part
(2) The method of resin-sealing according to (1), wherein the through hole is larger than the vibrating part in height in a direction perpendicular to the metal mask plate.
(3) The method of resin-sealing according to (1), wherein a portion of the through hole of the touch panel side is smaller than a portion of the through hole, which communicates with and is opposed to the portion of the through hole of the touch panel side, in width in a direction parallel to the metal mask plate, so that the through hole forms a step portion.
(4) A screen-printing metal mask plate comprising:
a metal mask plate body,
wherein the metal mask plate body faces to a surface of a board, on which an electronic part is mounted,
wherein the metal mask plate body includes a through hole that accommodates the electronic part, and is formed at a portion corresponding to the electronic part,
wherein the through hole is larger than the electronic part in height in a direction perpendicular to the metal mask plate body,
wherein the through hole includes a smaller through hole and a larger through hole that has a contour that includes a contour of the smaller through hole, and communicates with the smaller through hole, so that the through hole forms a step portion, and
wherein the contour of the smaller through hole is spaced from the electronic part by a gap corresponding to a thickness of a sealing resin that is to be deposited on the electronic part.
(5) The screen-printing metal mask plate according to (4), wherein the metal mask plate body includes a first metal mask plate body that faces to the board, and includes the smaller through hole that is formed at a portion corresponding to the electronic part, and a second metal mask plate body that is laminated on a surface of the first metal mask plate body, which is opposed to the board, and includes the larger through hole that communicates with the smaller through hole.
(6) The screen-printing metal mask plate according to (4), wherein the board includes a touch panel and the electronic part includes a piezoelectric substrate, and
wherein an inputting operation is inputted on the touch panel so that the inputting operation is detected and the touch panel is vibrated by the piezoelectric substrate.

(7) A metal mask plate for manufacturing a touch panel input device that includes an operating panel that has a transparent operating area, a touch panel that supports the operating panel, and an electronic part that is fixed to a portion of the touch panel, which corresponds to a periphery of the operating area, in which an inputting operation is inputted onto the operating area so that the inputting operating is detected by the electronic part, the metal mask plate comprising:
a metal mask plate body,
wherein the metal mask plate body faces to a surface of the touch panel, on which the electronic part is mounted,
wherein the metal mask plate body includes a through hole that accommodates the electronic part, and is formed at a portion corresponding to the electronic part,
wherein the metal mask plate body includes a relief recess that covers the operating area, is formed at a portion that faces to the touch panel and corresponds to the operating area.
(8) The metal mask plate according to (7),
wherein the electronic part includes a piezoelectric substrate, and
wherein the inputting operation is inputted on the touch panel so that the touch panel is vibrated by the piezoelectric substrate.

The sealing resin, having the thixotropic properties, has a low viscosity during flowing, that is, during the time when the sealing resin is moved over the metal mask plate by the squeegee to be filled in the resin inflow space, and even when the sealing resin is filled with a relatively low inflow pressure, the sealing resin can be filled into a narrow innermost (deepest) portion of the resin inflow space. And besides, after the sealing resin, having the thixotropic properties, ceases to flow after the metal mask plate is removed, the viscosity of the sealing resin becomes high, and therefore the sealing resin coating, deposited on the outer surface of the vibrating part, retains its shape.

The resin inflow space, having the gap corresponding to the thickness of the sealing resin coating, is formed between a side surface of the electronic part (mounted on the board) and the lower smaller through hole of the through hole, and therefore when the screen-printing metal mask plate is removed from the board in a vertical direction perpendicular to the board, the sealing resin coating of a predetermined thickness is deposited on the side surface of the electronic part.

When the screen-printing metal mask plate is removed from the board in the vertical direction, part of the sealing resin, deposited on an edge portion of an upper surface of the electronic part, is pulled by the viscosity of the sealing resin deposited on the step portion within the through hole, and is deposed on the through hole of the screen-printing metal mask plate.

And besides, the sealing resin, deposited on the edge portion of the upper surface of the electronic part, is cut to be separated from the screen-printing metal mask plate at the lower smaller through hole having a small area in the shearing direction, and therefore this sealing resin is soon cut as compared with the case where the sealing resin contacts the entire inner side surface of the through hole, and is considerably pulled up from the edge portion.

The lower smaller through hole and the upper-larger through hole can be formed respectively in the upper and lower metal mask plates by etching, and by joining the two metal mask plates in a laminated manner, the through hole, having the step portion, can be formed precisely so as to correspond to the mounted position of the electronic part.

A horn-like projection is less liable to be formed at the edge portion of the electronic part, and therefore a display panel, indicating indexes for an inputting operation on the touch panel, can be disposed in intimate contact with the upper surface of the electronic part.

Since the resin inflow space having a gap corresponding to the thickness of the sealing resin is formed between the outer surface of the electronic part and the through hole for accommodating the outer surface of the electronic part mounted on the touch panel, if the metal mask plate is removed from the touch panel, the sealing resin adheres to the peripheries of the electronic part.

When the sealing resin is filled into the resin inflow space, even if the sealing resin flows out into the gap between the touch panel and the metal mask plate around the resin inflow space, the sealing resin stays in the relief recess, so that the sealing resin does not leak to the operating area.

Even if the gap of the resin inflow space is narrow, and the sealing resin is filled with a high filling pressure, the sealing resin does not leak to the operating area, so that the thickness of the sealing resin on the piezoelectric substrate is made thin, and its vibration is not constrained by the sealing resin.

In the invention, the sealing resin is deposited on the vibrating part with the simple process, using the reusable metal mask plate, and therefore this method can be easily automated, and is suited form mass production of the resin-sealed vibrating parts.

And besides, the sealing resin can be filled in the narrow resin inflow space with the relatively low inflow pressure, and therefore the sealing resin, deposited on the flat surface of the vibrating part, will not be wiped off by the squeegee, and even the thin coating of the sealing resin can fully cover the vibrating part. Therefore, the sealing resin will not restrain the vibrating part from vibrating, and besides the vibrating part can be resin-sealed even when a mounting space for this vibrating part is limited.

Furthermore, the sealing resin, deposited on the outer surface of the vibrating part, retains its shape until the thermally-setting step, and therefore this sealing resin will not flow to the periphery of the vibrating part, and corner portions of the vibrating part will not be exposed, so that the vibrating part can be fully covered with the sealing resin. Therefore, the surface of the vibrating part will not be disposed in contact with the ambient air, and hence is prevented from aged deterioration.

In the invention, when the screen-printing metal mask plate is removed from the board, part of the sealing resin, deposited on the edge portion of the electronic part, adheres to the screen-printing metal mask plate, and-is cut off before this sealing resin is considerably pulled up. Therefore, a horn-like projection is less liable to remain on the cured sealing resin.

Therefore, the appearance of the resin-sealed electronic part will not be degraded, and incomplete insulation and incomplete contact will not occur.

In the invention, the through hole, having the step portion, can be easily and precisely formed in the screen-printing metal mask plate.

In the invention, the display panel can be disposed in proximity to the touch panel having the piezoelectric substrate fixed thereto, and display on the display panel can be easily viewed. And besides, a horn-like projection is hardly formed on the sealing resin sealing the piezoelectric substrate, and therefore the sealing resin will not contact other part or board disposed in proximity to the touch panel, so that the vibration of the piezoelectric substrate will not be restrained.

In the invention, since part of the sealing resin does not leak to the operating area, the field of view of the transparent operating area is not obstructed, so that the operator of the touch panel input device is able to reliably view the display of a display unit disposed inwardly thereof.

In addition, when the touch panel is covered with the metal mask plate, the metal mask plate is not brought into contact with the portion of the touch panel where the operating area is set. Therefore, even if the sealing resin, dust, or the like is attached to the metal mask plate, such foreign objects are not adhered to the operating area, and the field of view of the operating area is not obstructed.

BRIEF DESCRIPTION OF THE DRAWINGS

FIG. 2 shows the step of covering the touch panel with the metal mask plate 1.

FIG. 3 shows the filling step of filling a sealing resin 3 in a remaining gap in a resin inflow space 4 in such a manner that the pressure of inflow of the resin by a squeegee 5 is decreased.

FIG. 4 shows a condition in which the filling step is finished, that is, the sealing resin 3 is fully filled.

FIG. 5 shows the step of lifting the metal mask plate 1 in a vertical direction.

FIG. 6 shows the step of separating the sealing resin 3, deposited on the piezoelectric plate 120, from the sealing resin 3 deposited on the metal mask plate 1.

FIG. 12A is a plan view of a lower metal mask plate 1B of the metal mask plate 1, and FIG. 12B is a plan view of an upper metal mask plate 1A thereof.

FIG. 13A is a vertical cross-sectional view taken through a through hole 2 in a transverse direction thereof, and FIG. 13B is a partly-omitted vertical cross-sectional view taken through the through hole 2 in a longitudinal direction thereof.

FIG. 14A is a vertical cross-sectional view taken through the through hole 2 in the transverse direction thereof as seen from a rear side in the direction of sliding movement of a squeegee 5, and FIG. 14B is a partly-omitted vertical cross-sectional taken through the through hole 2 in the longitudinal direction thereof.

FIG. 15A is a vertical cross-sectional view taken through the through hole 2 in the transverse direction thereof, and FIG. 15B is a partly-omitted vertical cross-sectional view taken through the through hole 2 in the longitudinal direction thereof.

FIG. 16A is a vertical cross-sectional view taken through the through hole 2 in the transverse direction thereof, and FIG. 16B is a partly-omitted vertical cross-sectional view taken through the through hole 2 in the longitudinal direction thereof.

FIG. 17A is a vertical cross-sectional view taken through the through hole 2 in the transverse direction thereof, and FIG. 17B is a partly-omitted vertical cross-sectional view taken through the through hole 2 in the longitudinal direction thereof.

FIGS. 20A and 20B show a condition before starting a filling step for filling a sealing resin 3 into resin inflow spaces 4, in which FIG. 20A is a fragmentary vertical cross-sectional view taken along a transverse direction of a through hole 2, and FIG. 20B is a fragmentary vertical cross-sectional view taken along a longitudinal direction of the through hole 2.

FIGS. 21A and 21B show the filling step for filling the sealing resin 3 into the resin inflow spaces 4, in which FIG. 21A is a fragmentary vertical cross-sectional view taken along the transverse direction of the through hole 2 from the rear side in the sliding direction of a squeegee 5, and FIG. 21B is a fragmentary vertical cross-sectional view taken along the longitudinal direction of the through hole 2.

FIGS. 22A and 22B show a condition in which the filling step has been completed and the sealing resin 3 has been filled, in which FIG. 22A is a fragmentary vertical cross-sectional view taken along the transverse direction of the through hole 2, and FIG. 22B is a fragmentary vertical cross-sectional view taken along the longitudinal direction of the through hole 2.

DETAIL DESCRIPTION OF PREFERRED EMBODIMENTS

Figure 1:
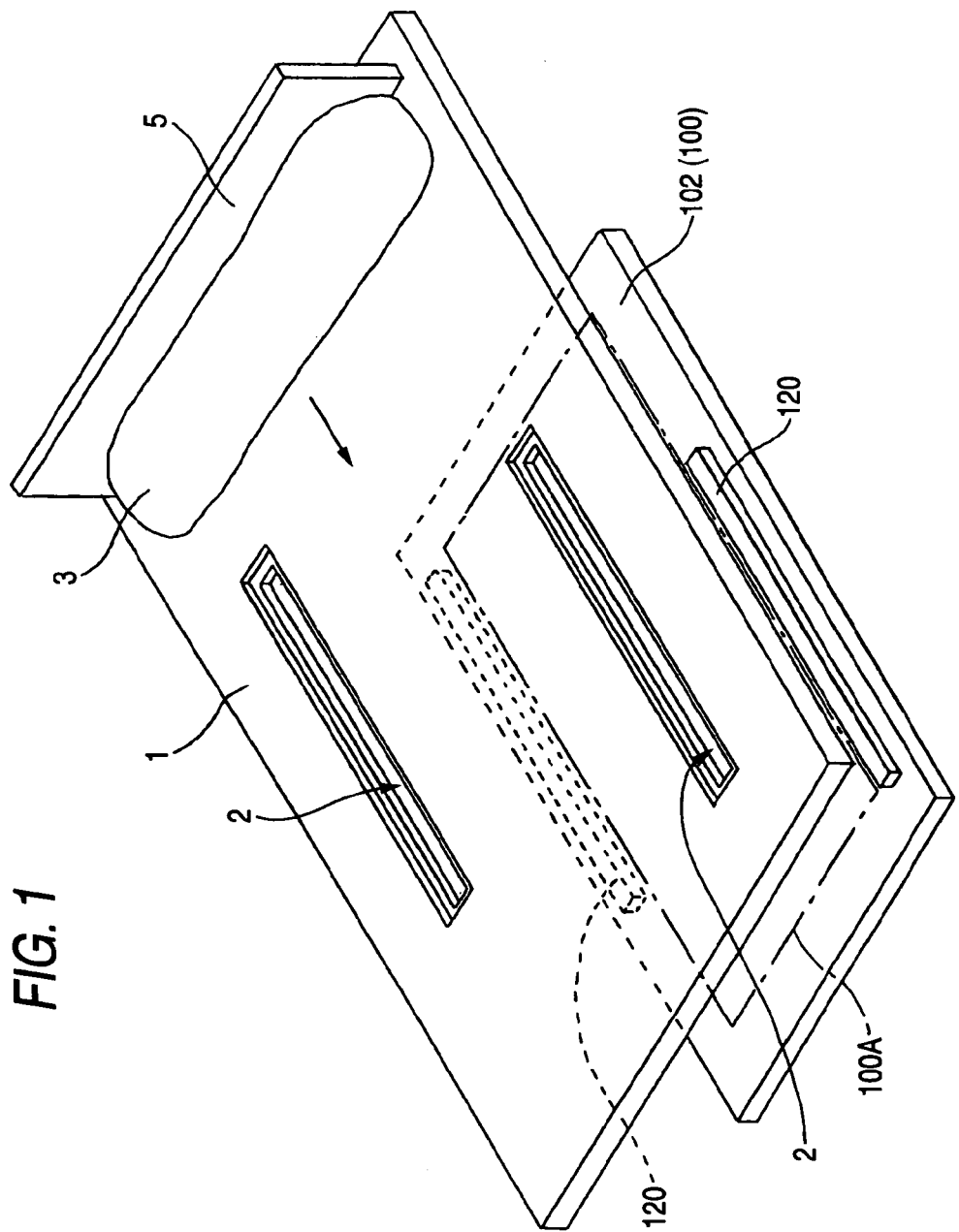
FIG. 1 is a perspective view showing the positional relation between piezoelectric substrate 120, fixed to a touch panel 102, and a metal mask plate 1.

First preferred embodiment of a vibrating part resin-sealing method of the present invention will now be described with reference to FIGS. 1 to 6. FIGS. 1 to 6 show one example of a method of resin-sealing piezoelectric substrates 120 used as vibrating parts in the touch panel input device 100 shown in FIGS. 7 and 8. FIG. 1 is a perspective view showing the positional relation between the piezoelectric substrates 120, fixedly secured to a touch panel 102, and a metal mask plate 1, and FIGS. 2 to 6 are views explanatory of the steps of a process of resin-sealing the vibrating parts 120.

Figure 7:
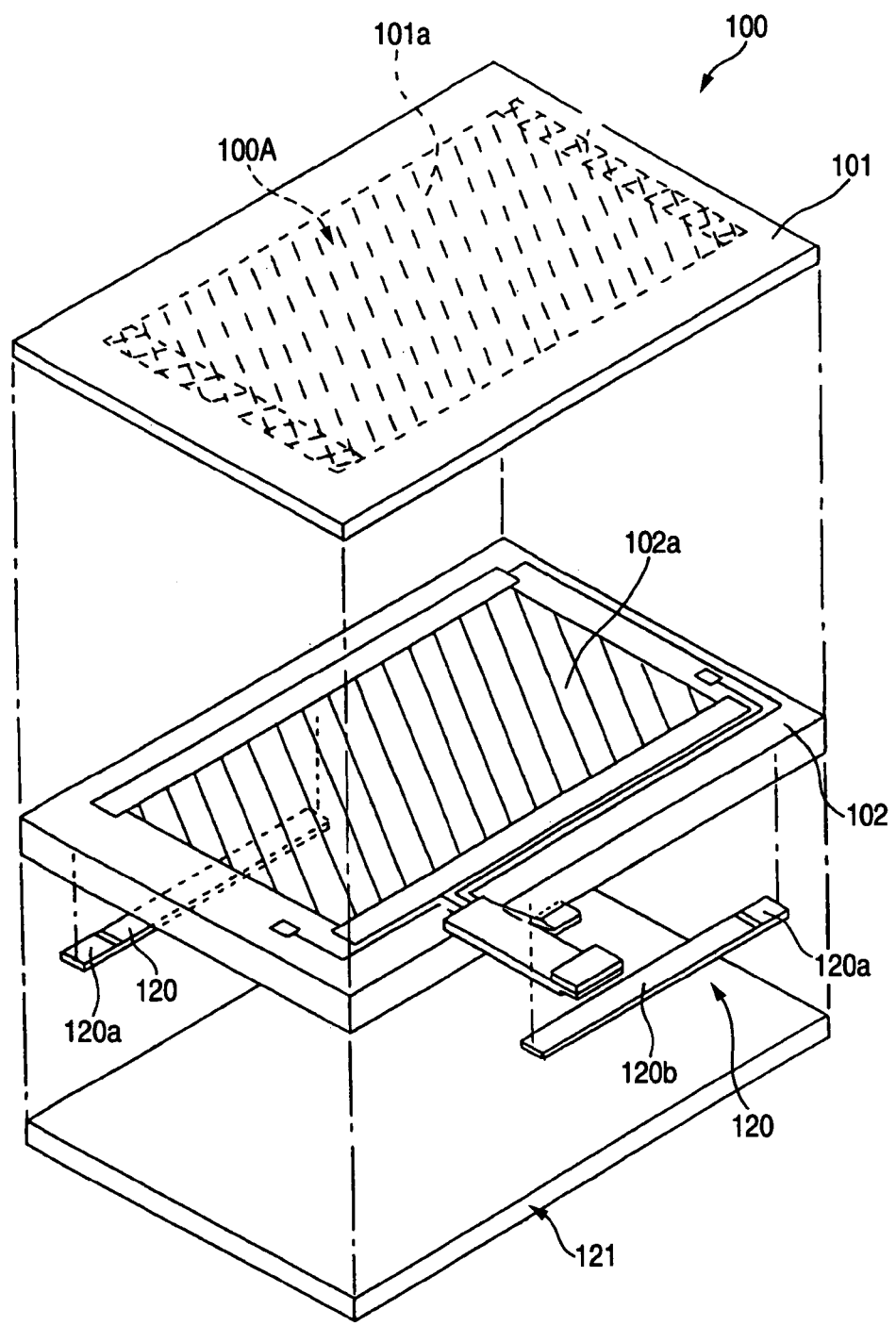
FIG. 7 is an exploded, perspective view of a touch panel input device 100.
Figure 8:
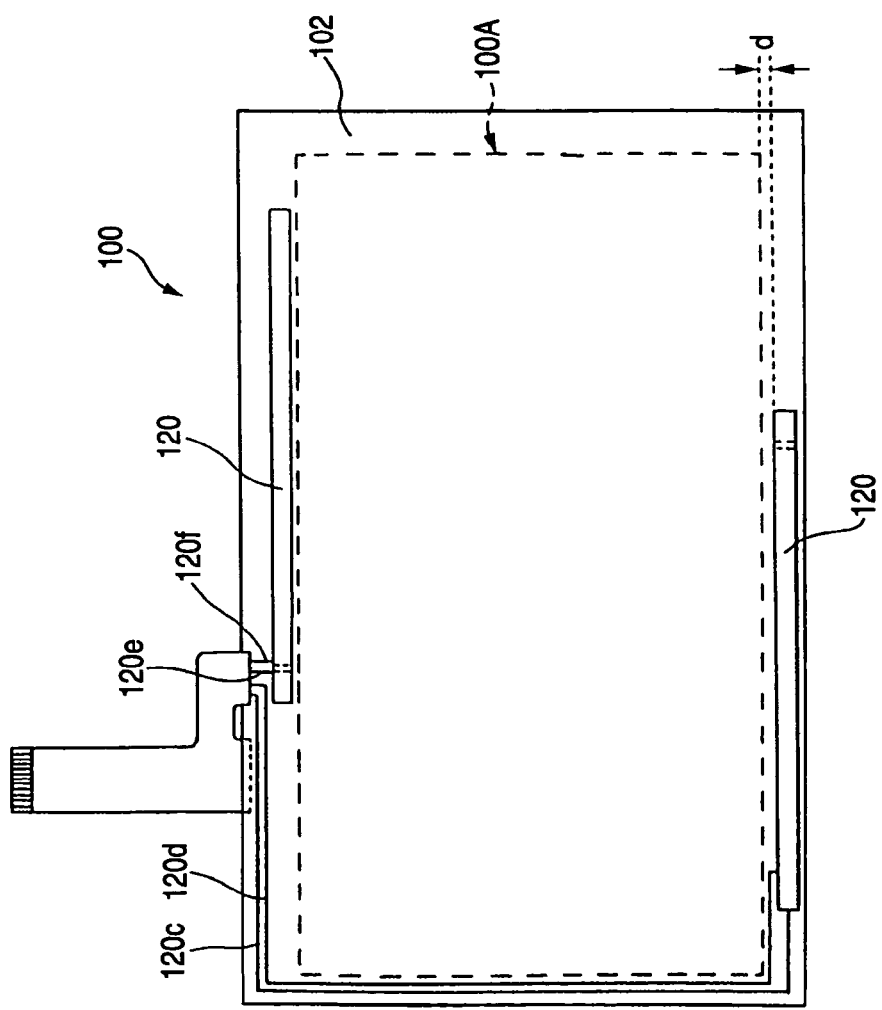
FIG. 8 is a rear view of a touch panel 102 to which piezoelectric plates 120 are fixed.
Figure 9:
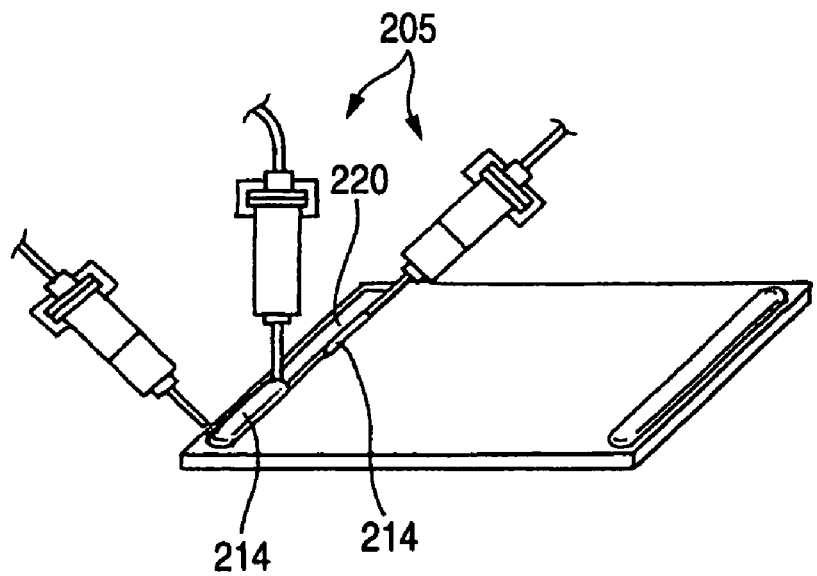
FIG. 9 is a perspective view showing a related sealing method employing a dispenser 105.
Figure 10:
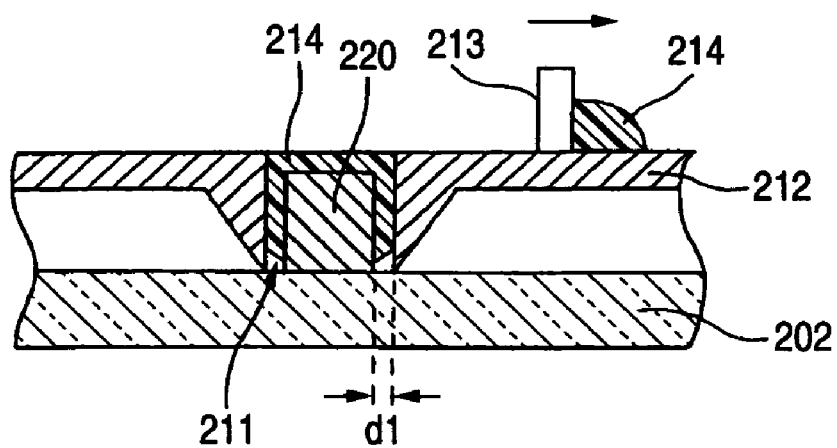
FIG. 10 is a vertical cross-sectional view showing a related screen-printing method.

Referring to FIGS. 7 and 8, a description will be first given of this touch panel input device 100 and the piezoelectric substrate 120 serving as its vibrating source. FIG. 7 is an exploded perspective view of the touch panel input device 100, and FIG. 8 is a rear view thereof.

The touch panel input device 100 is also called a digitizer, and an operating area 100A for detecting a pressed position is set in the touch panel formed by laminating an operating panel 101 and a supporting board 102 which are spaced apart with a small clearance therebetween. The illustrated touch panel input device 100 detects a pressed position on the basis of a resistance pressure sensitive method. For this reason, conductor layers 101a and 102a consisting of uniform resistance films are coated on opposing surfaces of the operating panel 101 and the supporting board 102, and the pair of piezoelectric substrates 120 are secured to a reverse surface side of the supporting board 102 in the periphery of the operating area 100A.

The operating panel 101 and the supporting board 102, as well as the conductor layers 101a and 102a coated on their opposing surfaces, are respectively formed of transparent materials to allow an operator to perform the pressing operation while viewing through the operating area 100A a display screen of a display unit 121, such as a liquid-crystal panel disposed inwardly of it (on the reverse surface side of the touch panel input device 100).

Each piezoelectric substrate 120 is formed in the shape of an elongated strip, and a pair of drive electrodes 120a and 120b is formed on each of obverse and reverse surfaces thereof. By using an adhesive or the like, the obverse surface side of the piezoelectric substrate 120 is secured to the reverse surface side of the supporting board 102, which forms the touch panel, at a small gap between the operating area 100A and a periphery of the supporting board 102 so as not to obstruct the operator's lines of sight toward the display unit.

The pressing operation with respect to the operating area 100A is detected by the contact between the conductor layers 101*a* and 102*a*. Upon detection of the pressing operation, a drive voltage is applied across the pair of drive electrodes 120*a* and 120*b* to vibrate the entire touch panel including the supporting board 102 to which the piezoelectric substrates 120 which contracts and expands are secured. From that vibration, the operator confirms that the pressing operation has been accepted.

As for the piezoelectric substrates 120 secured to the reverse surface of the supporting board 102, their drive electrodes 102*a* and 120*b* are exposed on their obverse and reverse sides or their side surfaces. Therefore, their outer surfaces are sealed with an insulating sealing resin to provide insulation from other parts and prevent the deterioration of the drive electrodes 120*a* and 120*b* themselves due to their secular changes.

As shown in FIG. 1, a rear touch panel (supporting board) 102 of the touch panel input device 100 is in the form of a rectangular plate, and an operating area 100A for detecting a pushed position is provided at a central portion of this touch panel 102. The touch panel 102 is made of a transparent material so that the operator can effect a pushing operation while seeing a display screen of a display unit (which is not shown, and is disposed beneath the operating area 100A) through the operating area 100A. The piezoelectric substrates 120 each in the form of a strip-like thin plate are fixedly secured to the rear surface of the touch panel 102, and are disposed at a narrow region between a periphery of the operating area 100A and a peripheral edge of the touch panel 102 so as not to intercept the operator's view toward the display screen of the display unit. In this embodiment, the pair of piezoelectric substrates 120 are fixedly secured to the touch panel 102, and are disposed adjacent to and along opposite longitudinal sides of the touch panel 102, respectively.

Figure 2A:
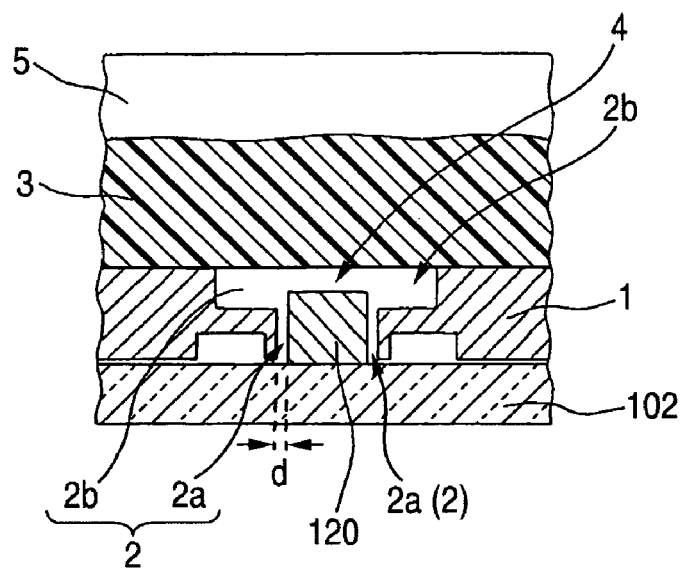
FIG. 2A is a vertical cross-sectional view taken through a through hole 2 in a transverse direction thereof.
Figure 2B:
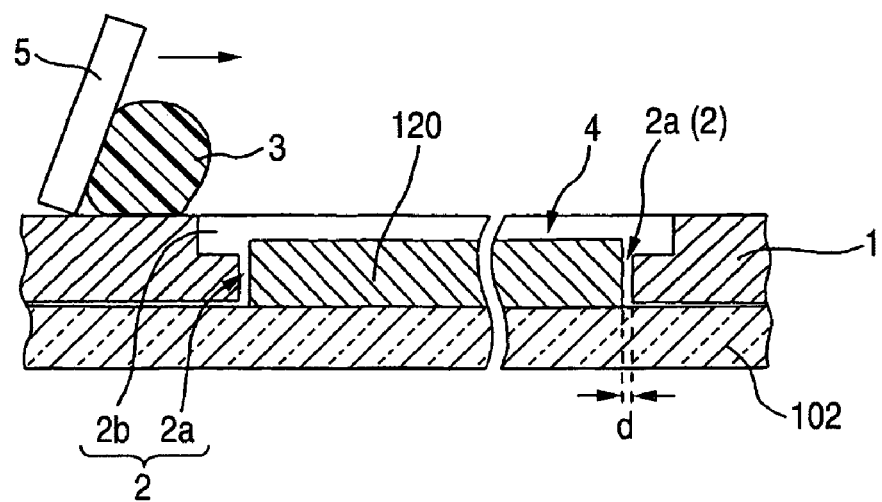
FIG. 2B is a partly-omitted vertical cross-sectional view taken through the through hole 2 in a longitudinal direction thereof.

The metal mask plate 1 comprises a metal plate made of a metallic material such as aluminum, stainless steel or the like. This metal mask plate 1 has a rectangular shape, and is larger in outer size than the touch panel 102 so that it can cover the whole of the rear surface of the touch panel 102. Through holes 2 are formed respectively at those portions of the metal mask plate 1 corresponding respectively to the fixed positions of the piezoelectric substrates 120. As shown in FIGS. 2A and 2B, the through hole 2 includes a smaller hole portion 2*a* (which is similar to a projected shape of the piezoelectric substrate 120 in a vertical direction (that is, in a direction perpendicular to the rear surface of the touch panel, and is slightly larger in transverse cross-sectional area than the piezoelectric substrate 120), and a larger hole portion 2*b* continuous with a step portion disposed at an upper side of the smaller hole portion 2*a*. A height of the through hole 2 is slightly higher than a height of the piezoelectric substrate 120.

The through holes 2 each having the step portion are formed, for example, by a method in which two metal sheets are prepared, and the smaller hole portions 2*a* are formed in one of the two metal sheets by etching, while the larger hole portions 2*b* are formed in the other metal sheet by etching, and thereafter the two metal sheets are joined in a laminated manner to form the single metal mask plate 1. When the touch panel 102 is covered with the thus formed metal mask plate 1, the whole of each piezoelectric substrate 120 is received within the corresponding through hole 2, and a resin inflow space 4 for the filling of a sealing resin 3 therein is formed between an inner side surface of the through hole 2 and the piezoelectric substrate 120 (see FIGS. 2A and 2B).

A gap of the resin inflow space 4, that is, particularly a gap between the piezoelectric substrate 120 and the inner surface of the smaller hole portion 2*a* is not larger than the distance d between the operating area 100A and the piezoelectric substrate 120 (Here, this gap is 0.5 mm, and is equal to the distance d) so that the sealing resin 3, deposited on the outer surface of the piezoelectric substrate 120, will not be forced out to the operating area 100A. The height of the piezoelectric substrate 120 is 0.7 mm, and the height or depth of the through hole 2 is 1 mm, and therefore is larger than the height of the piezoelectric substrate 120.

A synthetic resin, having at least insulating properties, thixotropic properties and thermosetting properties, is used as the sealing resin 3 which is to be filled in the resin inflow space 4. Here, an epoxy resin, having these properties, is used. The sealing resin 3 covers the entire outer surface of piezoelectric substrate 120 to which a pair of drive electrodes 120*a* and 120*b* is exposed, and therefore the sealing resin 3 is required to have the insulating properties so as to prevent the short-circuiting between these electrodes. The sealing resin 3, after filled in the resin inflow space, is heated to be set on the outer surface of the piezoelectric substrate 120, and therefore the sealing resin 3 is required to have the thermosetting properties. The thixotropic properties (also called thixotropy) are a nature of a material that is lowered in viscosity during flowing, and is returned to a high-viscosity original condition when left standing. This nature is required so that the sealing resin can be easily filled in the resin inflow space 4, and after the filling, the sealing resin can retain its shape until the thermally-setting step.

In addition, preferably, the sealing resin 3 has a low coefficient of contraction (shrinkage) upon thermally setting, and has a certain degree of elasticity upon thermally setting (that is, a low modulus of elasticity), and can be thermally set at a low temperature. The sealing resin 3, when filled in the resin inflow space 4, is deposited also on wiring patterns (120*c*, 120*d*, 120*e* and 120*f* in FIG. 8) extending from the piezoelectric substrates 120, and if the coefficient of contraction is high, these wiring patterns are pulled upon thermally setting of the sealing resin, thereby causing the separation and cutting of the patterns. Therefore, the sealing resin is required to have a low coefficient of contraction upon thermally setting. The sealing resin is required to have a certain degree of elasticity so that the thermally-set sealing resin will not prevent the piezoelectric substrate 120 from being strained. If the sealing resin is thermally set at a high temperature, the piezoelectric substrate 120 is degraded, and therefore it is desired that the sealing resin should be thermally set at a low temperature.

As shown in FIG. 1, the sealing resin 3 is put in a fluidized condition on one end portion of the metal mask plate 1, and is filled in the resin inflow spaces 4 (provided respectively in the through holes 2) by the screen-printing method employing a squeegee 5. The squeegee 5 can be made of any suitable material in so far as it can extrude the sealing resin 3 into the resin inflow spaces 4. Here, the squeegee 5, made of rubber, is used so that part of this squeegee can project into each through hole 2 from the surface of the metal mask plate 1 so as to increase the pressure of flow of the resin into the resin inflow space 4.

The steps of the process of sealing the piezoelectric substrates 120 with the sealing resin 3 by the use of the metal mask plate 1 and the squeegee 5 will be described below with reference to FIGS. 2 to 6.

First, the touch panel 102 is set on a slide table of a screen-printing machine (not shown) in such a manner that that surface of the touch panel 102 to which the piezoelectric substrates 120 are fixed is directed upwardly. As shown in FIG. 2, the metal mask plate 1, having the through holes 2, is superposed on the thus set touch panel 102 to cover the same. In this superposed condition, the resin inflow space 4 is formed between each piezoelectric substrate 120 and the inner surface of the corresponding through hole 2. The gap of the resin inflow space 4 between the periphery of the piezoelectric substrate 120 and the inner surface of the smaller hole portion 2a is as narrow as 0.5 mm, and the height of the piezoelectric substrate 120 is smaller than the height of the through hole 2, but is larger than the height of the smaller hole portion 2a, and therefore the piezoelectric substrate 120 projects slightly beyond the smaller hole portion 2a.

Figure 3A:
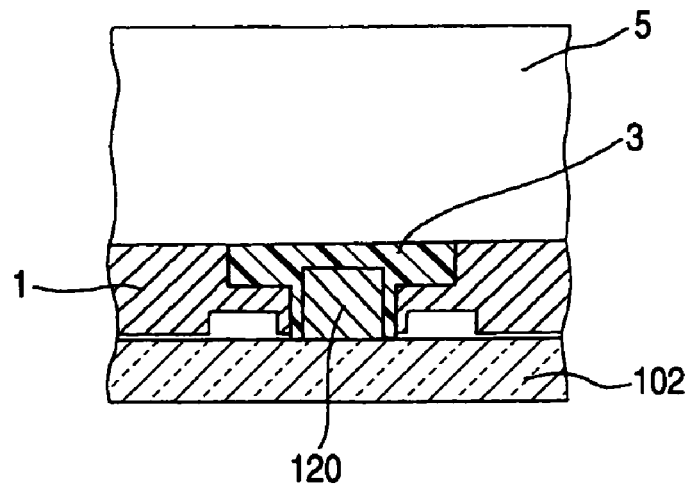
FIG. 3A is a vertical cross-sectional view taken through the through hole 2 in the transverse direction thereof as seen from a rear side in the direction of sliding movement of the squeegee 5.
Figure 3B:
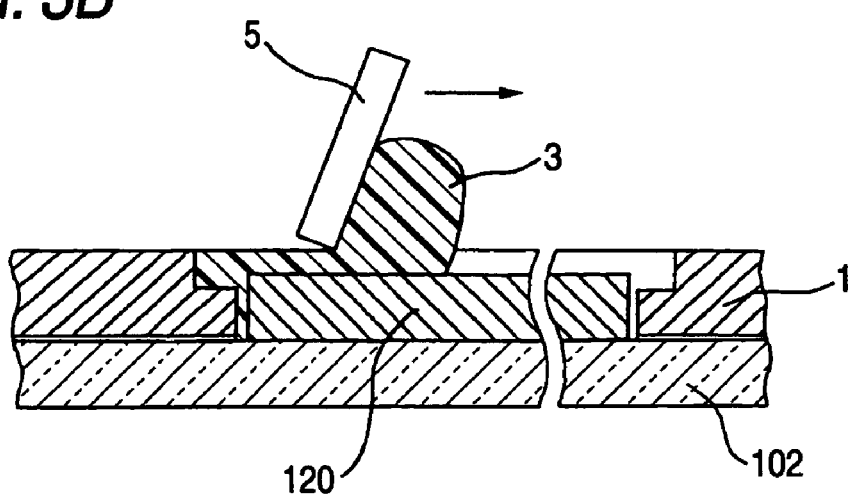
FIG. 3B is a partly-omitted vertical cross-sectional taken through the through hole 2 in the longitudinal direction thereof.
Figure 4A:
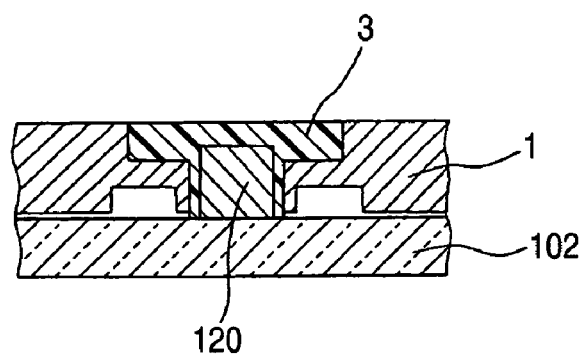
FIG. 4A is a vertical cross-sectional view taken through the through hole 2 in the transverse direction thereof.
Figure 4B:
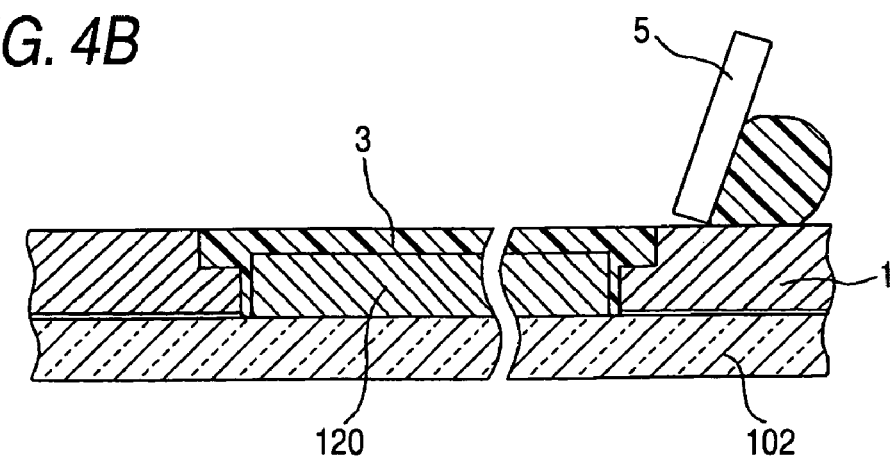
FIG. 4B is a partly-omitted vertical cross-sectional view taken through the through hole 2 in the longitudinal direction thereof.

Thereafter, the squeegee 5 is slid over the surface of the metal mask plate 1 to fill the sealing resin 3 (put on the one end portion of the metal mask plate 1) in the resin inflow spaces 4. In this filling operation, the squeegee 5, while pressed strongly against the metal mask plate 1 so as to increase the pressure of inflow of the sealing resin 3, is slid to fill the sealing resin 3 in each resin inflow space 4 as shown in FIG. 3. As a result, the sealing resin 3 is fully filled in the whole of each resin inflow space 4, including the front side gap thereof, without any cavity (see FIGS. 4A and 4B).

Figure 5A:
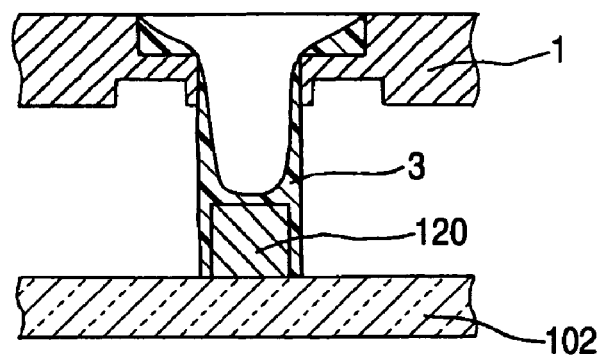
FIG. 5A is a vertical cross-sectional view taken through the through hole 2 in the transverse direction thereof.
Figure 5B:
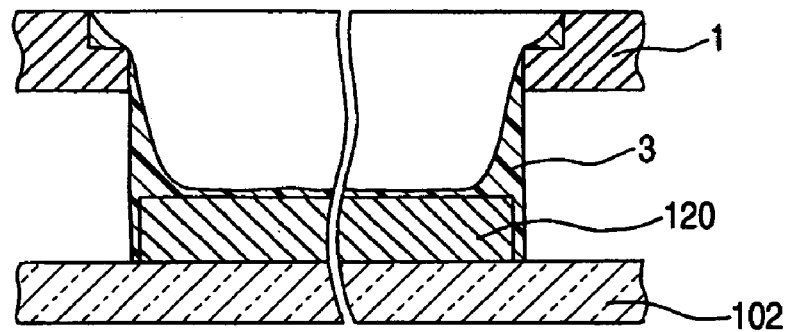
FIG. 5B is a partly-omitted vertical cross-sectional view taken through the through hole 2 in the longitudinal direction thereof.
Figure 6A:
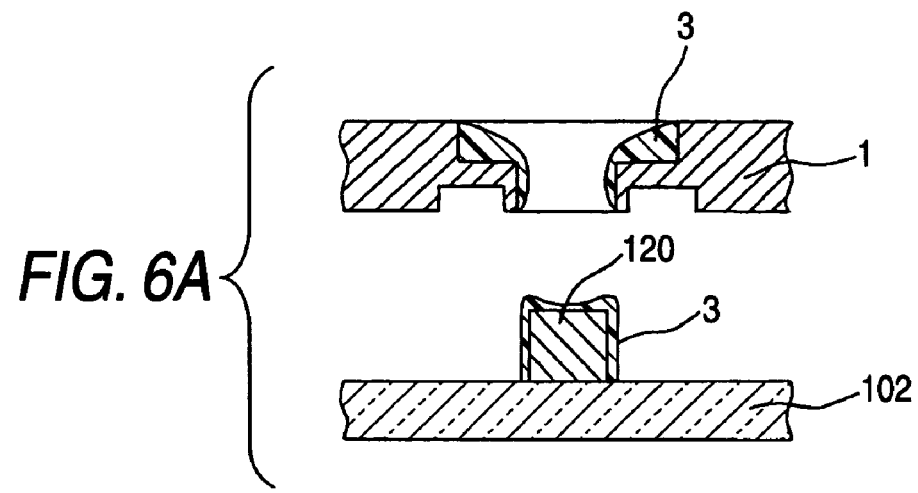
FIG. 6A is a vertical cross-sectional view taken through the through hole 2 in the transverse direction thereof.
Figure 6B:
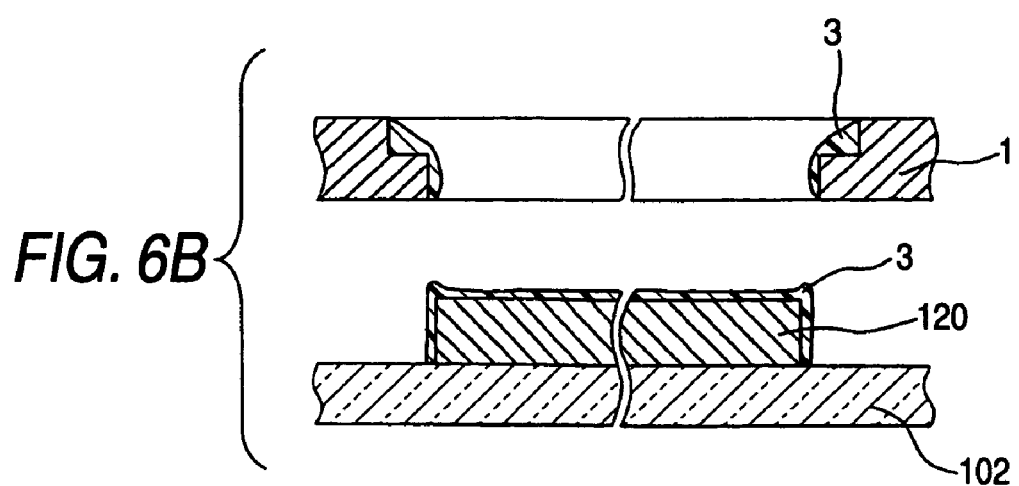
FIG. 6B is a partly-omitted vertical cross-sectional view taken through the through hole 2 in the longitudinal direction thereof.

Then, the metal mask plate 1 is lifted in a vertical direction as shown in FIG. 5, and the metal mask plate 1 is further lifted until the viscous sealing resin 3, adhering to the metal mask plate, is completely separated from the piezoelectric substrates 2. As a result, a coating of the sealing resin 3, having a substantially uniform thickness of 0.5 mm, is deposited on the entire outer surface of each piezoelectric substrate 120.

The touch panel 102, having the piezoelectric substrates 120 on which the sealing resin 3 is thus deposited, is transferred into a high-temperature furnace operating at a temperature of about 100° C., and the sealing resin 3 is thermally set. The sealing resin 3, deposited on the piezoelectric substrates 120, is left standing until this resin 3 is thermally set, and therefore the sealing resin 3 is returned to its high-viscosity original condition, and retains its shape. Therefore, the sealing resin will not flow downwardly along the side or peripheral surface of each piezoelectric substrate 120, and the sealing resin 3, completely covering the entire outer surface of the piezoelectric substrate 120, retains its shape in this condition, although this coating of the sealing resin is as thin as 0.5 mm.

The piezoelectric substrates 120, sealed with the thermally-set sealing resin 3, do not contact the ambient air, and are prevented from aged deterioration, and besides since the electrodes are covered with the sealing resin 3, there is no fear that these electrodes are brought into short-circuiting contact with other parts.

In the above embodiment, the vibrating part can take any other form than the piezoelectric plate in so far as it can serve as a vibration source fixed to the touch panel. The touch panel input device can be of any suitable detection type, and in the case where two panels are joined in a laminated manner as in this embodiment, the touch panel may be the upper-side operating panel 101.

The direction of sliding movement of the squeegee 5 in the filling process is arbitrary, and the squeegee 5 does not always need to be slid in the longitudinal direction of the through holes.

The present invention is suited for the method of resin-sealing the vibrating part fixedly secured to the touch panel.

Second preferred embodiment of a screen-printing metal mask plate (hereinafter referred to as "metal mask plate 1") of the present invention will now be described with reference to FIGS. 7, 8 and 11 to 17. The metal mask plate 1 of this embodiment is used when resin-sealing piezoelectric substrates 120 provided as vibrating parts in a touch panel input device 100 shown in FIGS. 7 and 8.

Figure 11:
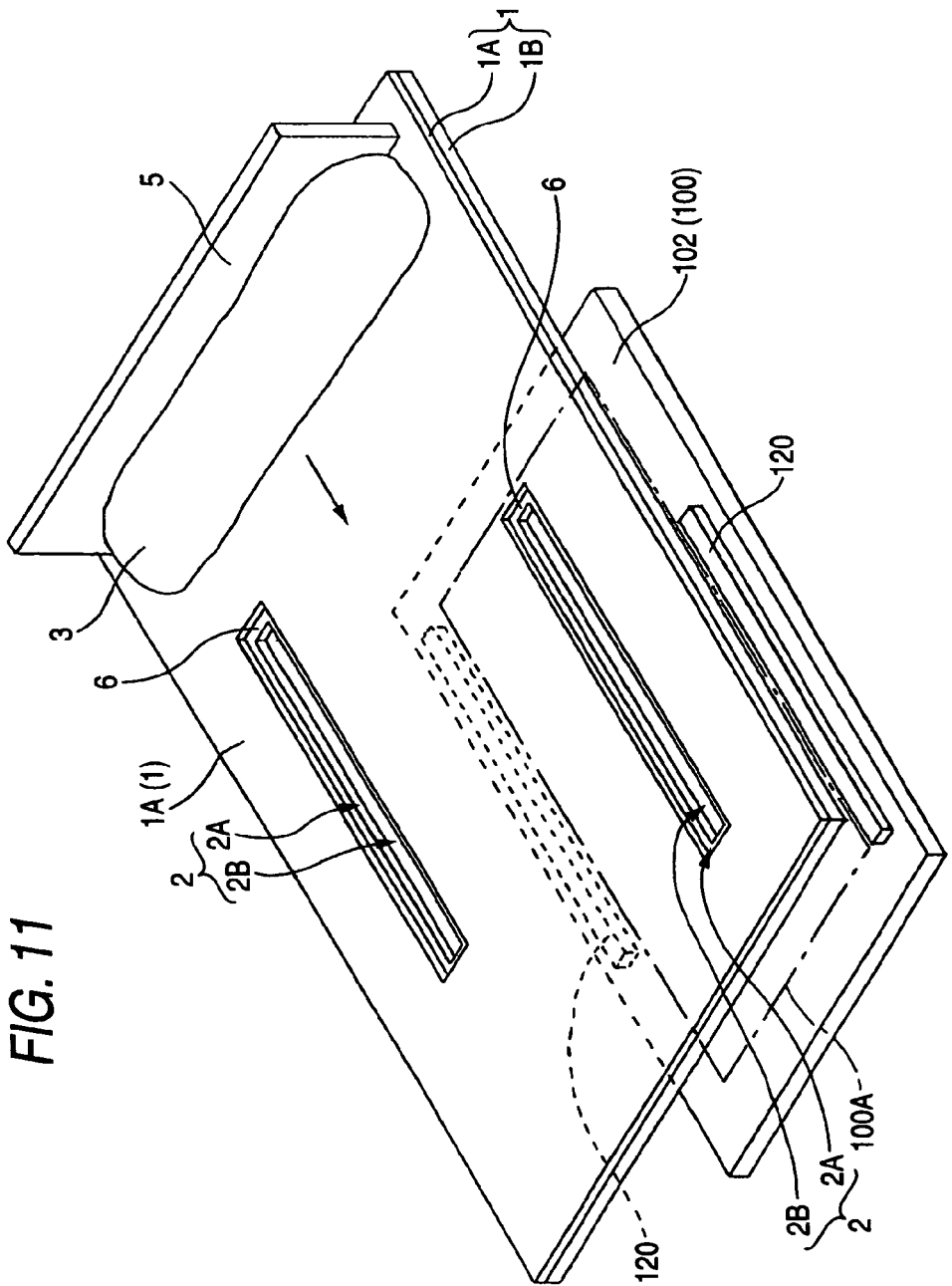
FIG. 11 is a perspective view showing the positional relation between piezoelectric substrates 120, fixed to a supporting board 102, and a metal mask plate 1.

As shown in FIG. 11, the rear surface of the supporting board 102 is covered with the metal mask plate 1, with this rear surface directed upwardly, and therefore in the following description, a rear side of the touch panel input device 100 will be referred to as the upper side, and hence a rear side of each piezoelectric substrate 120 will be referred to as an upper surface 120A.

The metal mask plate 1 comprises a metal plate made of a metallic material such as aluminum or stainless steel, and more specifically this metal mask plate 1 comprises an upper metal mask plate 1A and a lower metal mask plate 1B which have the same rectangular contour as shown in FIGS. 12A and 12B. The upper metal mask plate 1A is bonded to an upper surface of the lower metal mask plate 1B to form the laminated metal mask plate 1, and a thickness of this metal mask plate 1 is larger than a height (or thickness) of the piezoelectric substrate 120 fixedly secured to the supporting board 102.

Lower smaller through holes 2B of a generally tubular shape are formed vertically respectively through those portions of the lower metal mask plate 1B corresponding respectively to the positions of the piezoelectric substrates 120 fixed to the supporting board 102. The lower smaller through hole 2B is formed into such a contour as to surround the outer surface of the piezoelectric substrate 120 (fixed to the supporting board 102), with a gap d formed therebetween, the gap d corresponding to a thickness of a coating of the sealing resin 3. Namely, the contour of the lower smaller through hole 2B, projected on the supporting board 102, is outside the contour (indicated in a broken line in FIG. 12A) of the piezoelectric substrate 120 projected on the supporting board 102, and is spaced from this contour by the gap d corresponding to the thickness of the coating of the sealing resin 3 to be deposited on the side (or peripheral) surface of the piezoelectric substrate 120.

Upper larger through holes 2A of a generally tubular shape are formed vertically respectively through those portions of the upper metal mask plate 1A corresponding respectively to the positions of the lower smaller through holes 2B. The upper larger through hole 2A is formed into such a contour as to surround the periphery of the lower smaller through hole 2B (formed through the lower metal mask plate 1B), with a predetermined gap formed therebetween. Namely, as shown in FIG. 12B, the contour of the upper larger through hole 2A, projected on the supporting board 102, is outside the contour (indicated in a broken line in FIG. 12B) of the lower smaller through hole 2B, and is spaced from this contour by the predetermined gap. With this construction, when the upper metal mask plate 1A is secured to the upper surface of the lower metal mask plate 1B in a laminated manner, a stair-like step portion 6 is formed around the outer surface of the lower smaller through hole 2B (see FIG. 11).

The upper larger through holes 2A and the lower smaller through holes 2B are formed in the respective two metal mask plates 1A and 1B, for example, by etching, and thereafter the two metal mask plates 1A and 1B are superposed together, and are integrally fixed together by welding, bonding or the like to form the metal mask plate 1. As a result, through holes 2, each including the lower smaller through hole 2B and upper larger through hole 2A communicating with each other in the vertical direction (upward-downward direction), are formed through those portions of the metal mask plate 1 corresponding respectively to the fixed positions of the piezoelectric substrates 120. When the supporting board 102 is covered with the thus formed metal mask plate 1, the whole of each piezoelectric substrate 120 is received within the corresponding through hole 2, and a resin inflow space 4 for the filling of the sealing resin 3 therein is formed between the inner side surface of the through hole 2 and the piezoelectric substrate 120 (see FIGS. 15A and 15B).

A gap of the resin inflow space 4, that is, particularly a gap between the piezoelectric substrate 120 and the inner surface of the smaller through hole 2B is not larger than the distance d between the operating area 100A and the piezoelectric substrate 120 so that the sealing resin 3, deposited on the outer surface of the piezoelectric substrate 120, will not be forced out to the operating area 100A. Here, this gap is equal to the distance d, and is 0.5 mm. The height of the piezoelectric substrate 120 is 0.7 mm, and the height or depth of the through hole 2 is 1 mm, and therefore is larger than the height of the piezoelectric substrate 120.

A synthetic resin, having at least insulating properties, thixotropic properties and thermosetting properties, is used as the sealing resin 3 which is to be filled in the resin inflow space 4. Here, an epoxy resin, having these properties, is used. The sealing resin 3 covers the entire outer surface of piezoelectric substrate 120 to which a pair of drive electrodes 120a and 120b are exposed, and therefore the sealing resin 3 is required to have the insulating properties so as to prevent the short-circuiting between these electrodes. The sealing resin 3, after filled in the resin inflow space, is heated to be set on the outer surface of the piezoelectric substrate 120, and therefore the sealing resin 3 is required to have the thermosetting properties. The thixotropic properties (also called thixotropy) are a nature of a material which is lowered in viscosity during flowing, and is returned to a high-viscosity original condition when left standing. This nature is required so that the sealing resin can be easily filled in the resin inflow space 4, and after the filling, the sealing resin can retain its shape until the thermally-setting step.

In addition, preferably, the sealing resin 3 has a low coefficient of contraction (shrinkage) upon thermally setting, and has a certain degree of elasticity upon thermally setting (that is, a low modulus of elasticity), and can be thermally set at a low temperature. The sealing resin 3, when filled in the resin inflow space 4, is deposited also on wiring patterns (120c, 120d, 120e and 120f in FIG. 8) extending from the piezoelectric substrates 120, and if the coefficient of contraction is high, these wiring patterns are pulled upon thermally setting of the sealing resin, thereby causing the separation and cutting of the patterns. Therefore, the sealing resin is required to have a low coefficient of contraction upon thermally setting. The sealing resin is required to have a certain degree of elasticity so that the thermally-set sealing resin will not prevent the piezoelectric substrate 120 (serving as a vibration source) from being strained. If the sealing resin is thermally set at a high temperature, the piezoelectric substrate 120 reaches a Curie point, so that the polarization is disturbed, and the piezoelectric substrate will not be strained even when a drive voltage is applied thereto. Therefore, it is desired that the sealing resin should be thermally set at a low temperature.

As shown in FIG. 11, the sealing resin 3 is put in a fluidized condition on one end portion of the metal mask plate 1, and is filled in the resin inflow spaces 4 (provided respectively in the through holes 2) by the screen-printing method employing a squeegee 5. The squeegee 5 can be made of any suitable material in so far as it can extrude the sealing resin 3 into the resin inflow spaces 4. Here, the squeegee 5, made of rubber, is used.

The steps of the process of sealing the piezoelectric substrates (electronic parts) 120 with the sealing resin 3 by the use of the metal mask plate 1 and the squeegee 5 will be described below with reference to FIGS. 11 and 13 to 17.

Figure 13A:
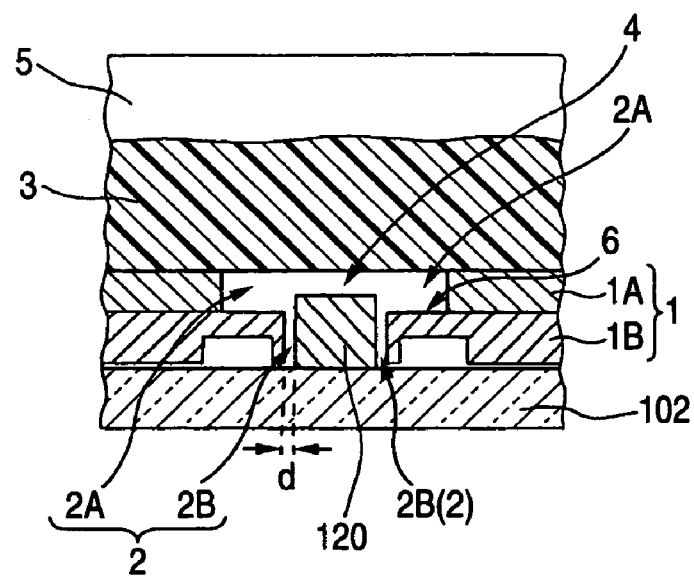
FIGS. 13A and 13B show a condition before the filling step of filling a sealing resin 3 in a resin inflow space 4 is started.
Figure 13B:
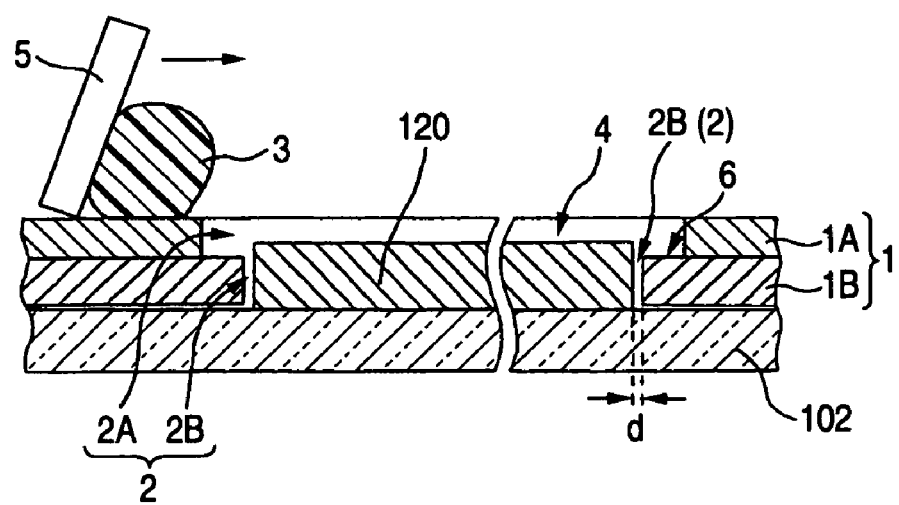

First, the supporting board 102 is set on a slide table of a screen-printing machine (not shown) in such a manner that that surface of the supporting board 102 to which the piezoelectric substrates 120 are fixed is directed upwardly. As shown in FIGS. 11 and 13, the metal mask plate 1, having the through holes 2, is superposed on the thus set supporting board 102 to cover the same. In this superposed condition, the resin inflow space 4 is formed between each piezoelectric substrate 120 and the inner surface of the corresponding through hole 2. The gap of the resin inflow space 4 between the outer surface of the piezoelectric substrate 120 and the inner surface of the lower smaller through hole 2B is as narrow as 0.5 mm, and the height of the piezoelectric substrate 120 is smaller than the height of the through hole 2, but is larger than the height of the lower smaller through hole 2B, and therefore the piezoelectric substrate 120 projects slightly beyond the lower smaller through hole 2B.

Figure 14A:
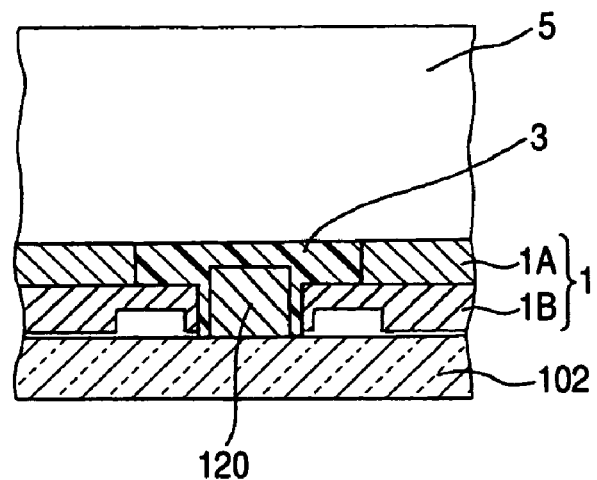
FIGS. 14A and 14B show the filling step of filling the sealing resin 3 in the resin inflow space 4.
Figure 14B:
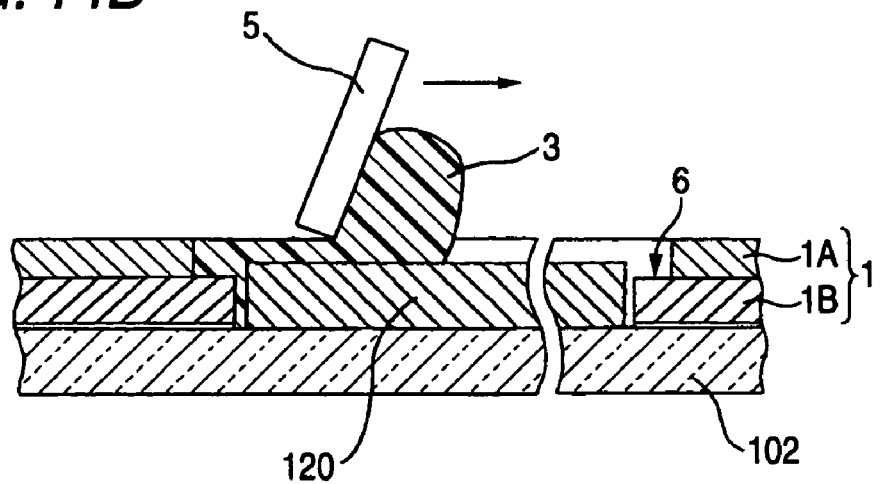
Figure 15A:
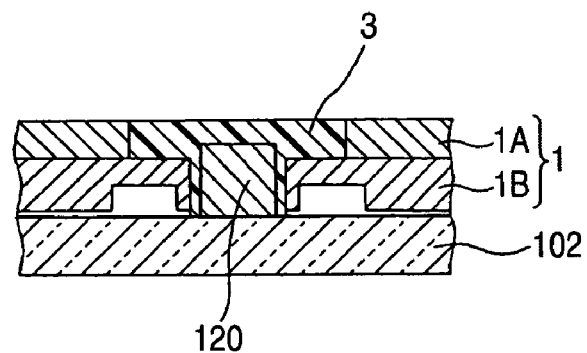
FIGS. 15A and 15B show a condition in which the filling step is finished, that is, the sealing resin 3 is fully filled.
Figure 15B:
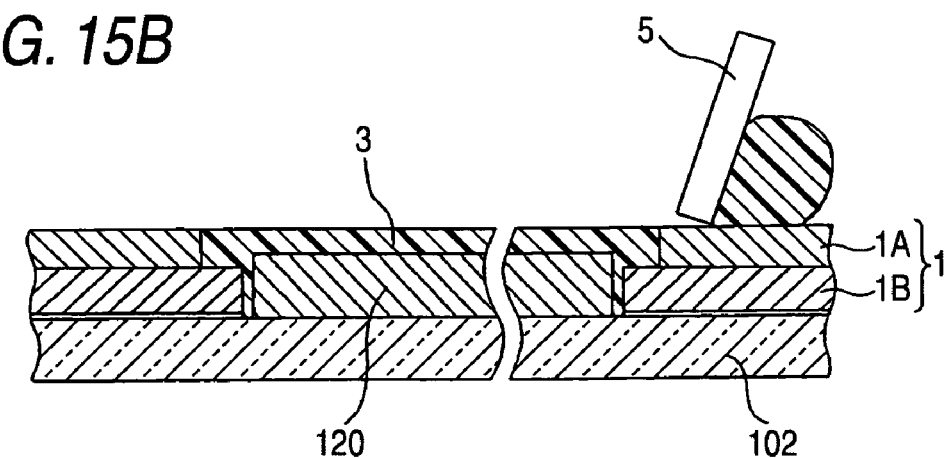

Thereafter, the squeegee 5 is slid over the surface of the metal mask plate 1 to fill the sealing resin 3 (put on the one end portion of the metal mask plate 1) in the resin inflow spaces 4. In this step of filling the sealing resin 3, the squeegee 5 is slid over the surface of the metal mask plate 1 to push the sealing resin 3 (put on the one end portion of the metal mask plate 1) along the surface of the metal mask plate 1 as shown in FIGS. 14A and 14B, thereby filling the sealing resin 3 uniformly in each resin inflow space 4 (see FIGS. 15A and 15B).

Figure 16A:
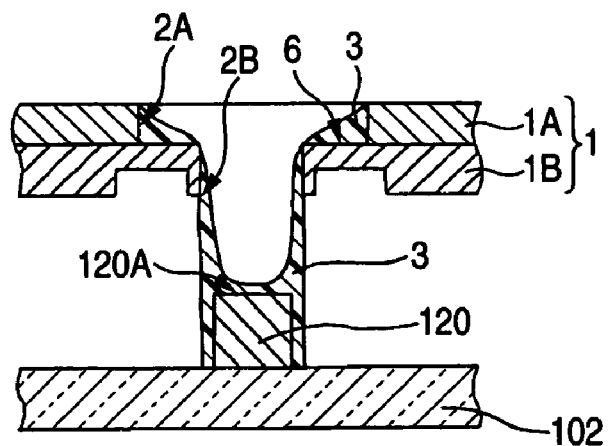
FIGS. 16A and 16B show the step of lifting the metal mask plate 1 in a vertical direction.
Figure 16B:
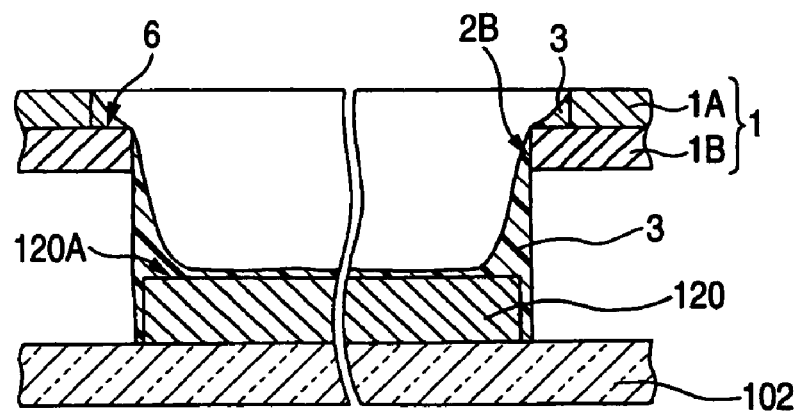
Figure 17A:
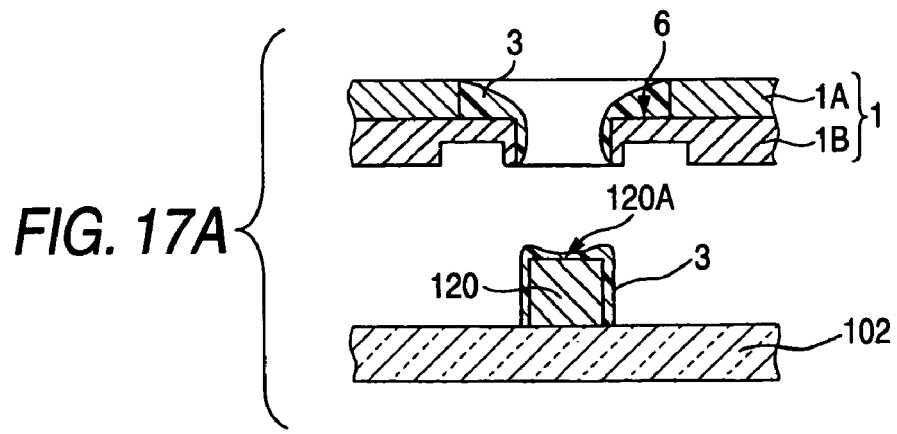
FIGS. 17A and 17B show the step of separating the sealing resin 3, deposited on the piezoelectric plate 120, from the sealing resin 3 deposited on the metal mask plate 1.
Figure 17B:
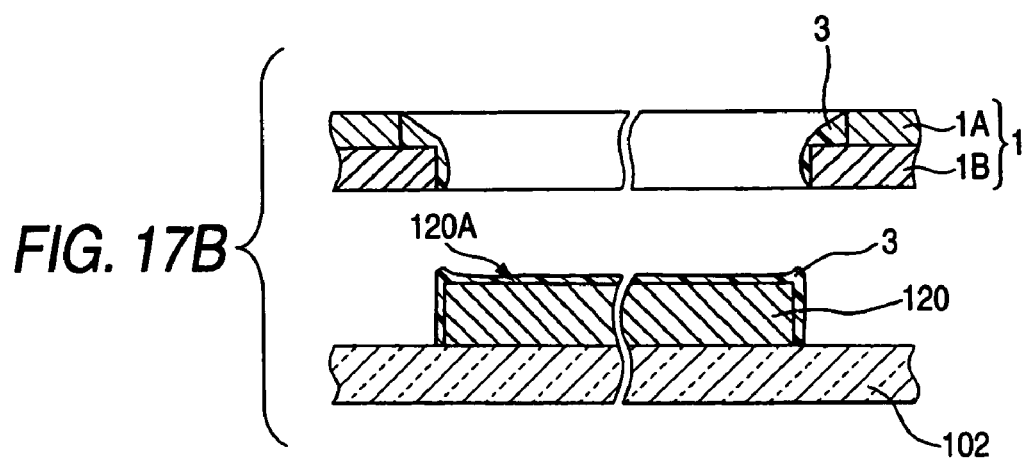

Then, the metal mask plate 1 is lifted in a vertical direction perpendicular to the supporting board 102 as shown in FIGS. 16A and 16B, and the metal mask plate 1 is further lifted until the viscous sealing resin 3, adhering to the metal mask plate, is completely separated from the piezoelectric substrates 2 as shown in FIGS. 17A and 17B. During the time when the sealing resin 3, deposited on the outer surface of the piezoelectric substrate 120, is separated from the metal mask plate 1, part of the sealing resin 3, deposited on an edge portion of the upper surface 120A of the piezoelectric substrate 120, is pulled up toward the metal mask plate 1 by the viscosity of the sealing resin 3 remaining on the step portion 6, so that the amount of the sealing resin 3, deposited on the edge portion, is reduced as shown in FIGS. 16A and 16B. And besides, the only portion which contacts the sealing resin 3 in a direction (vertical direction) of shearing or cutting of the sealed resin 3 is the inner side surface of the lower smaller through hole 2B which is smaller in cross-sectional area than the whole of the through hole 2. Therefore, the force of adhering of the sealing resin 3 to the metal mask plate 1 is weak, and the sealing resin can be cut off by even slightly lifting the metal mask plate 1.

Therefore, after the metal mask plate 1 is completely removed, any horn-like projection is not formed at the edge portion of the upper surface 120A of the piezoelectric substrate 120, and even if such a projection develops, this projection is kept to a small height, and a coating of the sealing resin 3, having a generally uniform thickness of about 0.5 mm, is deposited on the entire outer surface of the piezoelectric substrate 120.

The supporting board 102, having the piezoelectric substrates 120 on which the sealing resin 3 is thus deposited, is transferred into a high-temperature furnace operating at a temperature of about 180° C., and the sealing resin 3 is thermally set and fixed. The sealing resin 3, deposited on the piezoelectric substrates 120, is left standing until this resin 3 is thermally set, and therefore the sealing resin 3 is returned to its high-viscosity original condition, and retains its shape. Therefore, the sealing resin will not flow downwardly along the side or peripheral surface of each piezoelectric substrate 120, and the sealing resin 3, completely covering the entire outer surface of the piezoelectric substrate 120, retains its shape in this condition, although this coating of the sealing resin is as thin as 0.5 mm.

The piezoelectric substrates 120, sealed with the thermally-set sealing resin 3, do not contact the ambient air, and are prevented from aged deterioration, and besides since the electrodes are covered with the sealing resin 3, there is no fear that these electrodes are brought into short-circuiting contact with other parts. Furthermore, any horn-like projection is not formed at the edge portion of the upper surface 120A of the piezoelectric substrate 120, and therefore a display panel such as a liquid crystal display panel can be disposed in proximity to the rear side of the supporting board 102, so that the operator can easily view indications on the display panel through the touch panel.

In the above embodiment, although the electronic part to be resin-sealed is the piezoelectric substrate serving as the vibrating part, the invention can be applied to any suitable metal mask used when resin-sealing any of various electronic parts which can be mounted on a plate or board.

Although the through holes, each having the step portion, are formed through the metal mask plate 1 formed by joining the metal mask plates 1A and 1B in a laminated manner, there can be used a single metal mask plate 1 through which through holes, each having a step portion, are formed by cutting or other processing method.

The present invention is suited for the metal mask plate used for depositing the sealing resin on the outer surface of the electronic part, mounted on the printed wiring board or the like, by the screen-printing method.

Referring now to FIGS. 7, 8 and 18 to 24, a description will be given of a metal mask plate in accordance with third embodiment of the invention. The metal mask plate 1 in accordance with this embodiment is used at the time of resin sealing a piezoelectric substrate 120 that serves as a vibrating part for a touch panel input device 100 shown in FIGS. 7 and 8.

Figure 18:
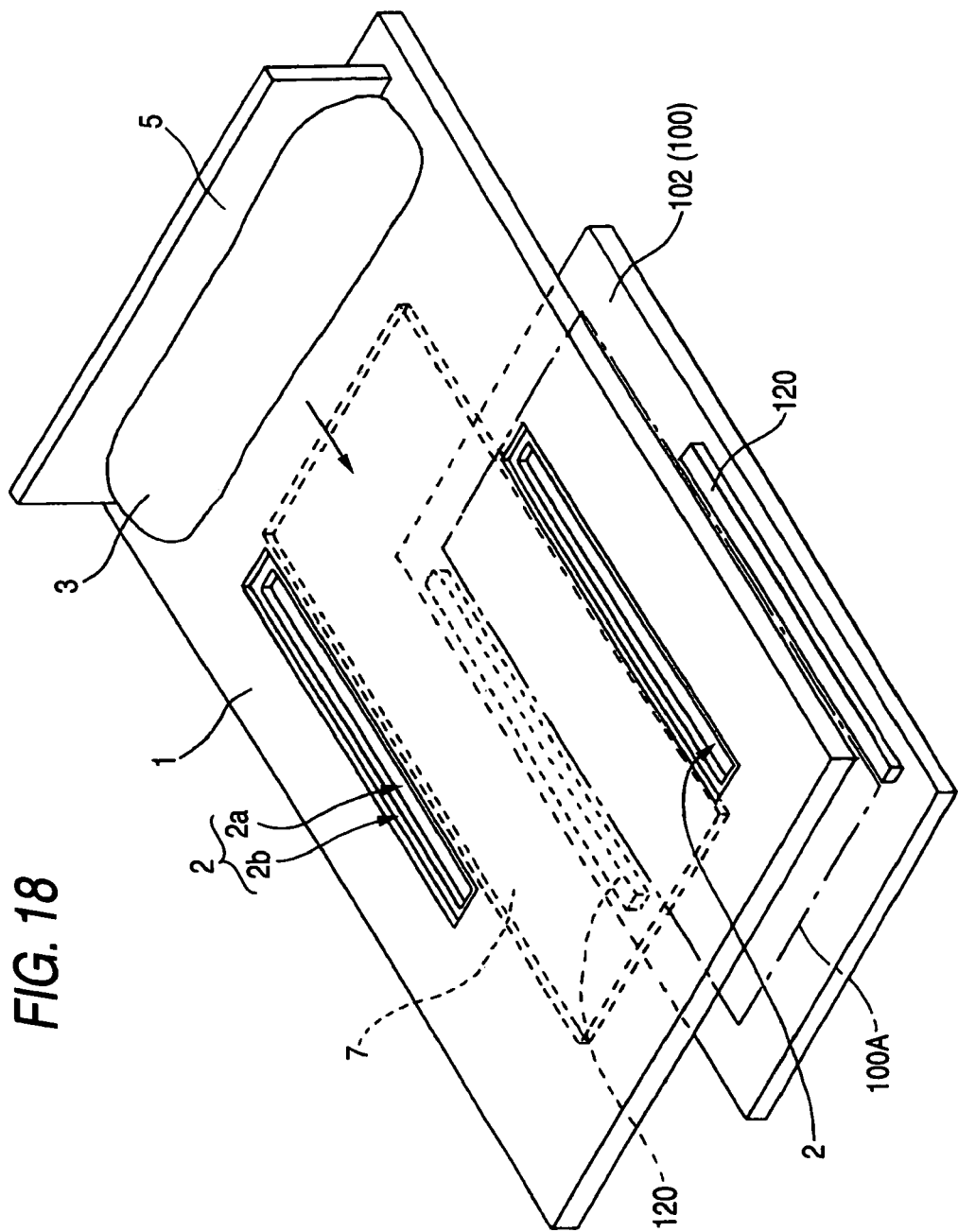
FIG. 18 is a perspective view illustrating the positional relationship between a metal mask plate 1 and piezoelectric substrates 120 secured to a touch panel 102.

It should be noted that, in the following description, since the reverse surface of the supporting board 102 is covered with the metal mask plate 1 with the reverse surface side of the supporting board 102 facing upward, as shown in FIG. 18, a description will be given by assuming that the direction toward the rear surface of the touch panel input device 100 shown in FIG. 7 is an upward direction, and that the surface of the metal mask plate 1 opposing the supporting board 102 in a state in which the supporting board 102 is covered is a bottom surface.

Figure 19:
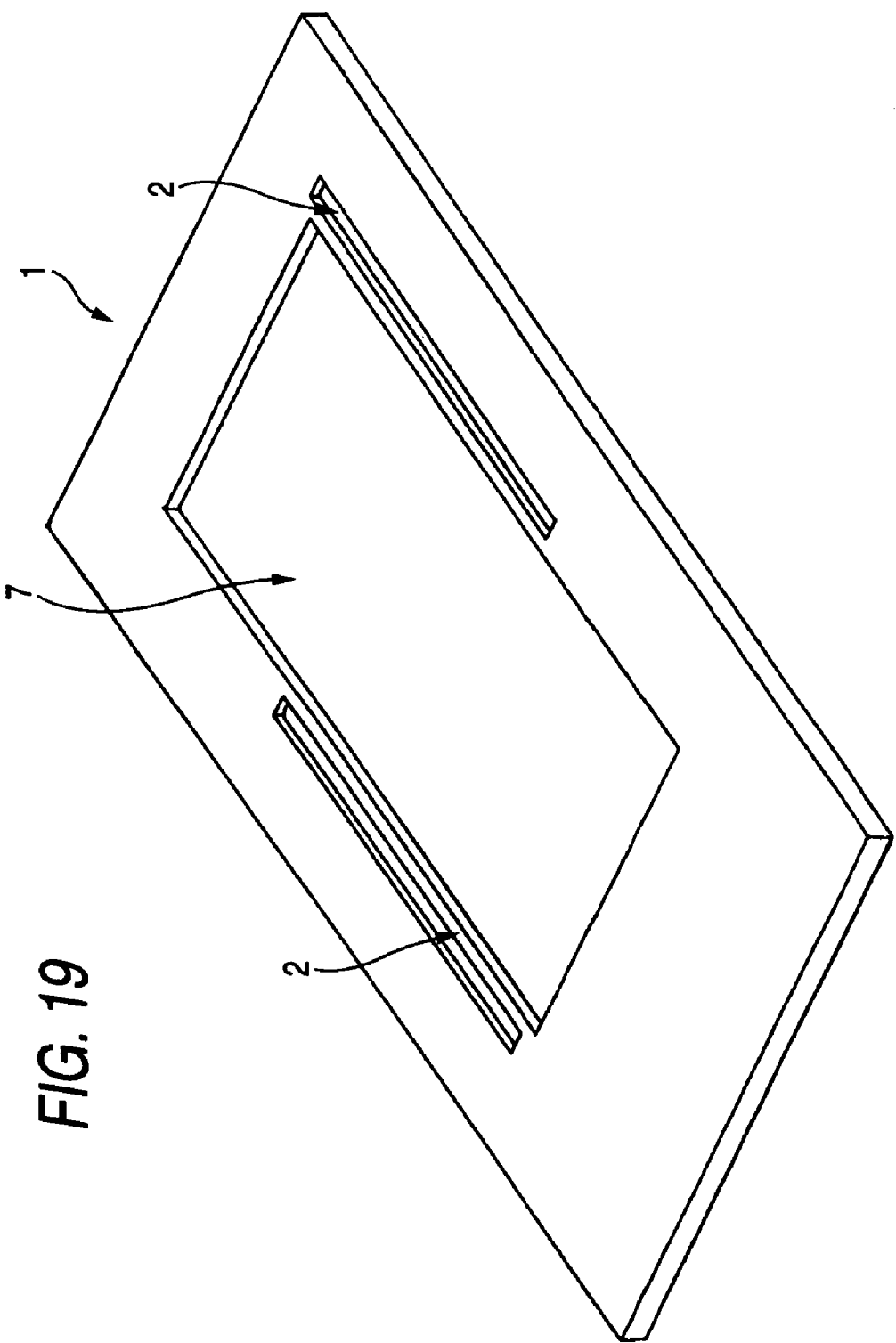
FIG. 19 is a perspective view of the metal mask plate 1 as viewed from its bottom surface side.

The metal mask plate 1 is a metallic plate formed of a metallic material such as aluminum, stainless steel, or the like, and is formed in the shape of a rectangular plate whose outer shape is larger than that of the supporting board 102 so as to cover the entire reverse surface of the supporting board 102. Through holes 2 are formed in the metal mask plate 1 at portions corresponding to the positions where the piezoelectric substrates 120 are secured. As shown in FIGS. 18 and 19, each through hole 2 consists of a smaller hole portion 2a having a cross sensational shape which is similar to but slightly larger than the shape of the piezoelectric substrate 120 projected onto the bottom surface of the metal mask plate 1, as well as a larger hole portion 2b continuing from stepped portions at upper ends thereof. The overall height of the through hole 2 is set to be slightly higher than the height of the piezoelectric substrate 120.

The through hole 2 having the stepped portions is formed by forming the smaller hole portion 2a and the larger hole portion 2b in two metal plates, respectively, by providing etching processing, for instance, and by superposing the two metal plates into a single metal mask plate 1. In addition, a relief recess 7 is provided in the bottom surface of the metal mask plate 1 opposing the supporting board 102 in a rectangular region surrounding a projected region in which the operating area 100A is projected onto the bottom surface in the state in which the reverse surface of the supporting board 102 is covered. This relief recess 7 is formed by providing half etching processing to the just-mentioned region when the through holes 2 are formed by providing etching processing.

Figure 20A:
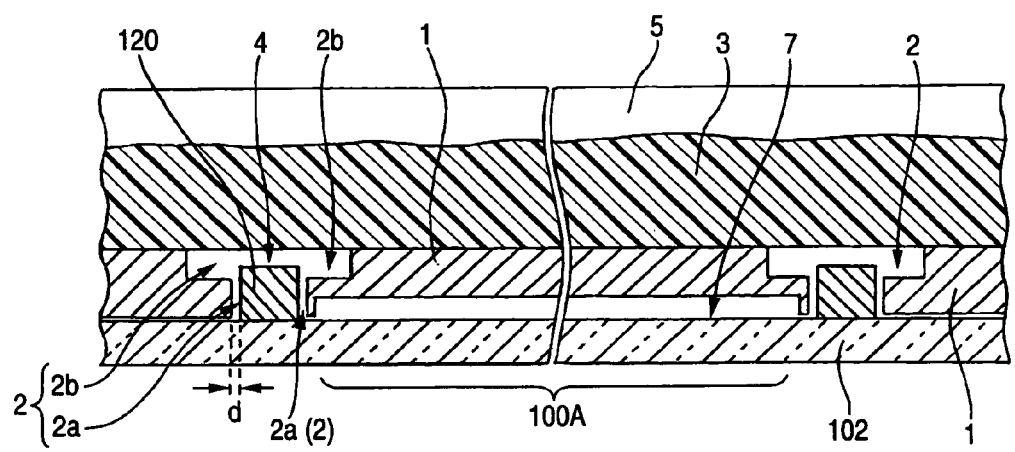
Figure 20B:
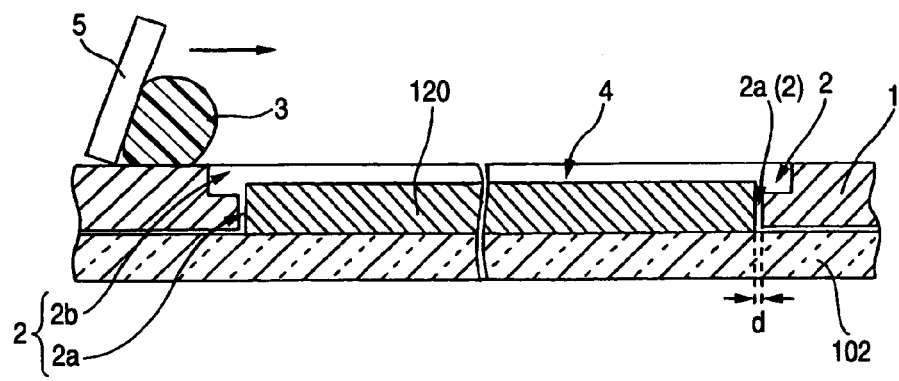

If the supporting board 102 is covered with the metal mask plate 1 thus formed, the entire outer piezoelectric substrates 120 are accommodated in the through holes 2, and a resin inflow space 4 for filling a sealing resin 3 is formed between the inner side surfaces of each through hole 2 and the piezoelectric substrate 120 (see FIGS. 20A and 20B).

The interval of the resin inflow space 4, particularly the interval the piezoelectric substrate 120 and the smaller hole portion 2a, is set to be not greater than a gap d between the operating area 100A and the piezoelectric substrate 120 so that the sealing resin 3 adhering to the side surface of the piezoelectric substrate 120 does not project toward the operating area 100A side. Here, this interval is set to 0.5 mm which is equal to that gap d. In addition, in a case where the height of the piezoelectric substrate 120 is 0.7 mm, the height of the through hole 2 is set to 1 mm which is higher than that height.

The relief recess 7 is provided at a depth of 0.2 mm from the bottom surface of the supporting board 102, and is spaced apart from the resin inflow space 4 by the metal mask plate 1 abutting against the supporting board 102 at the peripheries of the through holes 2.

As the sealing resin 3 which is filled in the resin inflow space 4, a synthetic resin which has at least an insulating property, a thixotropic property, and a thermosetting property is used. Here, an epoxy resin having these properties is used. The insulating property is required for not short-circuiting the pair of drive electrodes 120a and 120b since the entire outer surfaces of the piezoelectric substrates 120 where these electrodes are exposed are covered. The thermosetting property is required as the property of the sealing resin 3 since the sealing resin 3 is heated after being filled and is allowed to cure around the piezoelectric substrates 120. In addition, the thixotropic property refers to a property whereby the material undergoes a decline in viscosity during flow but resumes its original state of high viscosity if left to stand. The thixotropic property is required to ensure that the sealing resin 3 is easily filled in the resin inflow space 4 and to maintain its shape until a heat hardening process after the filling, as will be described later.

In addition, it is preferred that the sealing resin 3 have a low coefficient of shrinkage at the time of thermosetting and have a fixed degree of elasticity after the thermosetting, i.e., its coefficient of elasticity should be a small value, and that the sealing resin 3 should thermoset at a low temperature. The reason that a low coefficient of shrinkage at the time of thermosetting is required is that the sealing resin 3 at the time of being filled into the resin inflow space 4 adheres also to wiring patterns (120*c*, 120*d*, 120*e*, and 120*f* in FIG. 8) led out from the piezoelectric substrates 120, and if the coefficient of shrinkage is high, these wiring patterns are pulled in, possibly causing the exfoliation or disconnection of the patterns. In addition, the reason that a fixed degree of elasticity is required is to ensure that the strain of the piezoelectric substrates 120 serving as vibration sources is not constrained after curing. The reason that the thermosetting at a low temperature is required is that if the temperature is made high for curing, the piezoelectric substrates 120 reach the Curie point, so that polarization is disturbed, and even if a drive current is applied, the piezoelectric substrates 120 cease to be distorted.

As shown in FIG. 18, this sealing resin 3 is placed on one end of the metal mask plate 1 in a flowing state, and is filled into the resin inflow spaces 4 of the through holes 2 by the screen-printing process using a squeegee 5. The squeegee 5 may be formed of an arbitrary material if it is capable of extruding the sealing resin 3 into the resin inflow spaces 4. Here, the squeegee 5 made of rubber is used.

Hereafter, referring to FIGS. 18 and 20 to 24, a description will be given of respective steps for sealing the piezoelectric substrates 120, i.e., electronic parts, with the sealing resin 3 by using the metal mask plate 1 in accordance with this embodiment.

Initially, the supporting board 102 is set on a slide table of an unillustrated screen-printing machine with the fixing side of the piezoelectric substrate 120 as an obverse side. Then, the metal mask plate 1 having the through holes 2 is superposed on the set supporting board 102 in such a manner as to cover it, as shown in FIGS. 18 and 20. In the superposed state, the resin inflow space 4 is formed between the respective piezoelectric substrate 120 and the through hole 2, and the relief recess 7 of the metal mask plate 1 is opposed to the region where the operating area 100A of the supporting board 102 has been set.

Accordingly, even if the metal mask plate 1 with dust, the remnant of the sealing resin 3, or the like attached to its bottom surface is unintentionally superposed on the supporting board 102, the metal mask plate 1 is not brought into direct contact with the region of the operating area 100A by virtue of the relief recess 7. Therefore, the transparency of the region of the operating area 100A is not impaired.

Figure 21A:
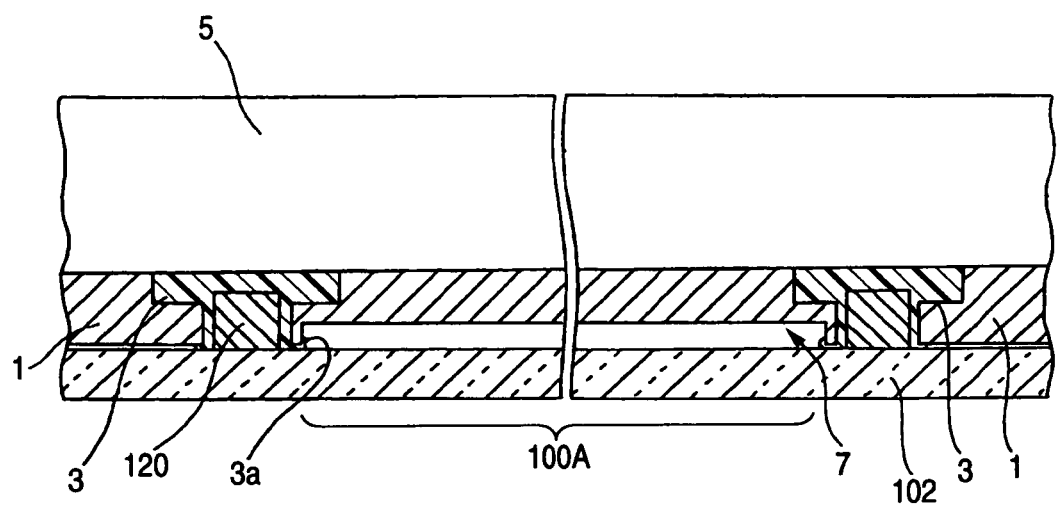
Figure 21B:
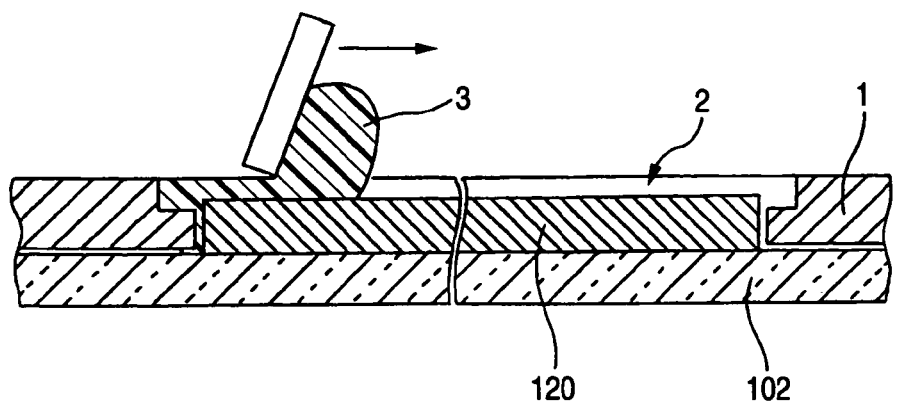
Figure 22A:
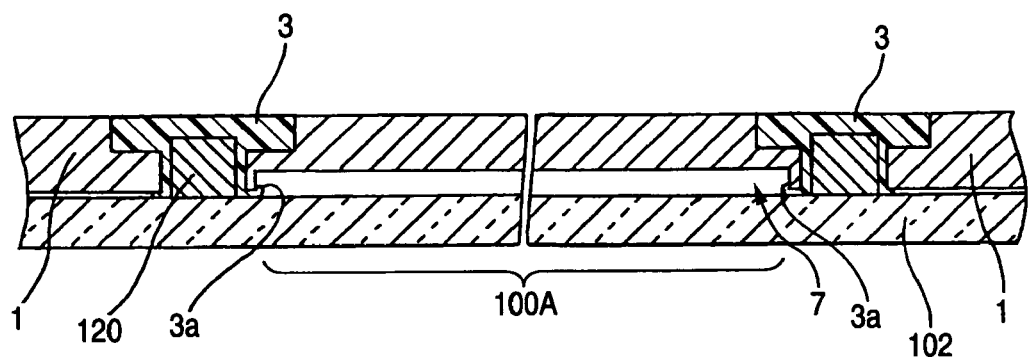
Figure 22B:
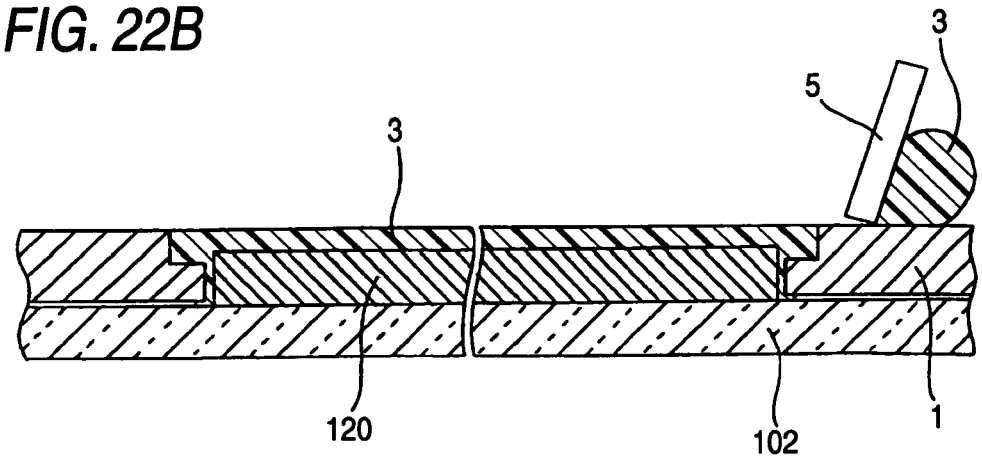

Subsequently, the squeegee 5 is slid along the surface of the metal mask plate 1 to allow the sealing resin 3 placed on one side of the metal mask plate 1 to be filled into the resin inflow spaces 4. In this filling step of the sealing resin 3, as shown in FIGS. 21A and 21B, the squeegee 5 is slid along the surface of the metal mask plate 1 to extrude along the surface of the metal mask plate 1 the sealing resin 3 which is in the flowing state and placed on one side of the metal mask plate 1, thereby allowing the sealing resin 3 to be thoroughly filled in the resin inflow spaces 4 including the obverse surface side of each piezoelectric substrate 120 (see FIGS. 22A and 22B).

In this filling step for filling the sealing resin 3, if the filling pressure is high, part 3*a* of the sealing resin 3 filled into the resin inflow space 4 leaks from the gap between the metal mask plate 1 and the supporting board 102, but stays and stops at an edge of the relief recess 7 before reaching the region of the supporting board 102 where the operating area 100A is set.

Figure 23:
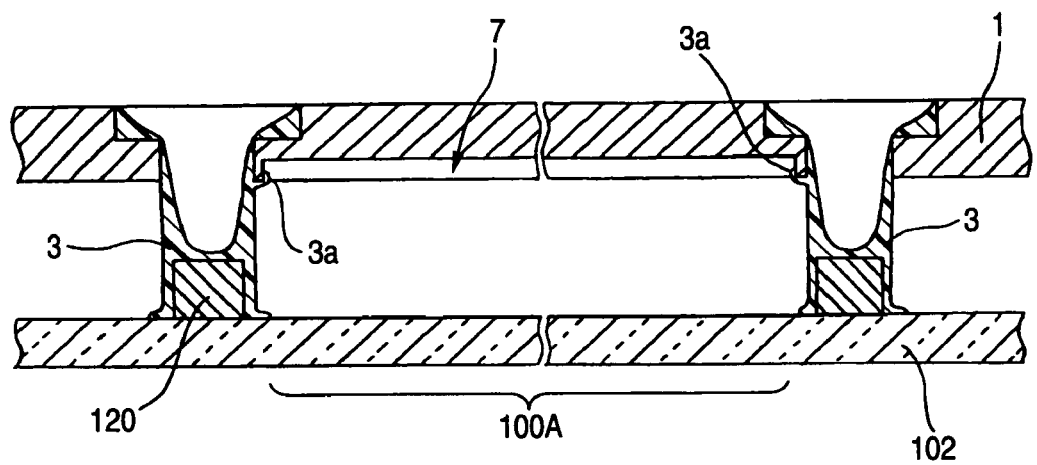
FIG. 23 is a fragmentary vertical cross-sectional view illustrating a step of vertically pulling the metal mask plate 1 upward.
Figure 24:
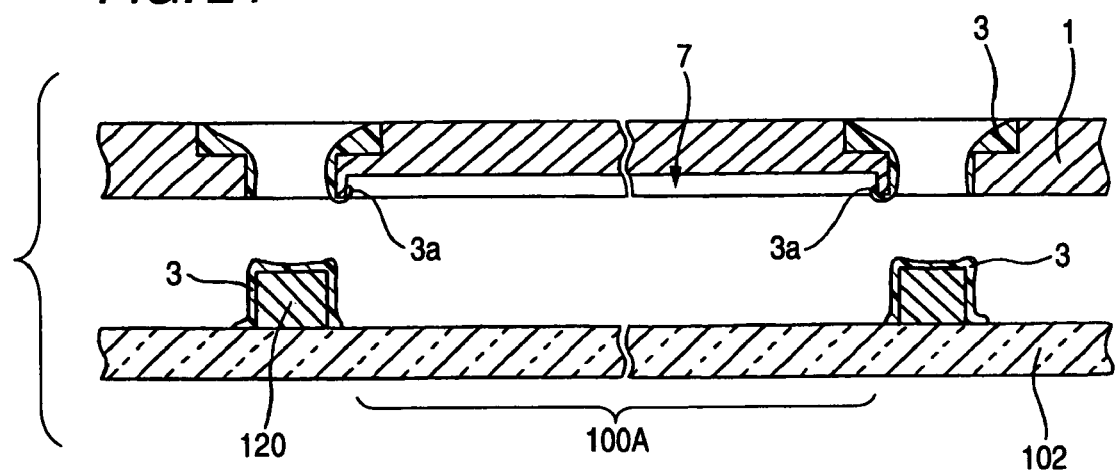
FIG. 24 is a fragmentary vertical cross-sectional view illustrating a step in which the sealing resin 3 on the piezoelectric substrate 120 side and the metal mask plate 1 side has been separated.
Figure 25:
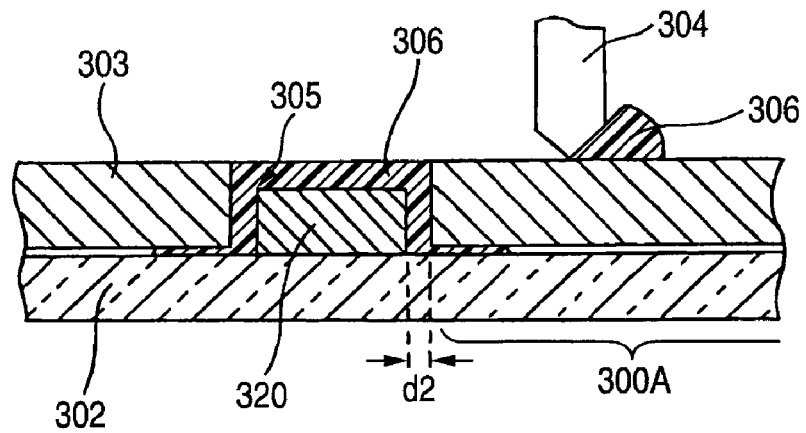
FIG. 25 is a vertical cross-sectional view showing a related screen-printing process in which a sealing resin 306 is deposited on an outer surface of an electronic part, using a related metal mask plate 303.
Figure 26:
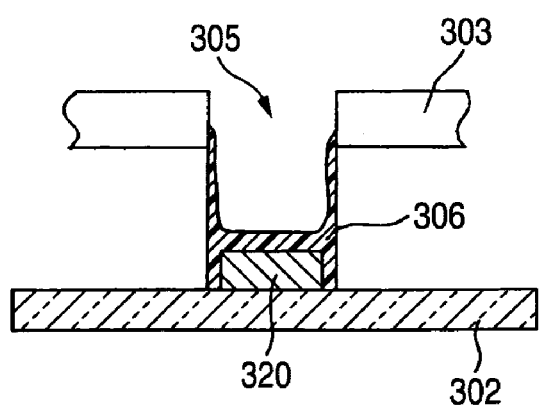
FIG. 26 is a vertical cross-sectional view showing a condition in which the metal mask plate 303 is lifted.
Figure 27:
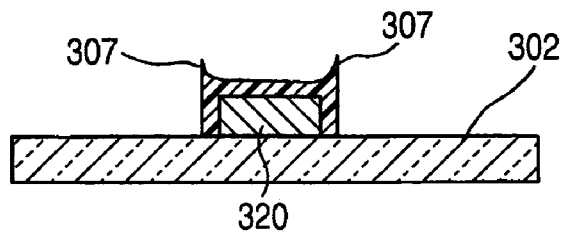
FIG. 27 is a vertical cross-sectional view showing a condition in which the metal mask plate 303 is completely separated from the sealing resin 306 deposited on the electronic part 320.
Figure 28:
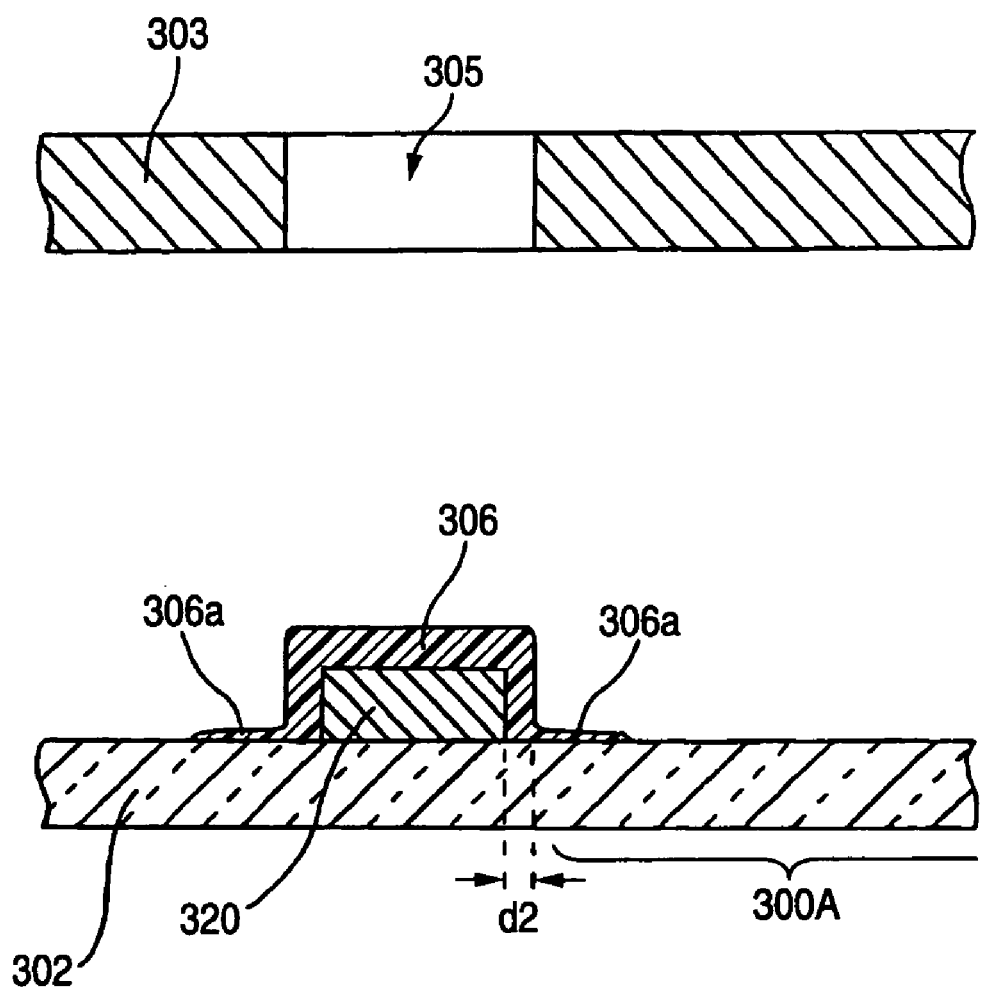
FIG. 28 is a vertical cross-sectional view illustrating a state in which the metal mask plate 303 has been completely pulled off the sealing resin 3 adhering to the electronic part 320.

Subsequently, as shown in FIG. 23, the metal mask plate 1 is pulled upward in a vertical direction perpendicular to the supporting board 102, and is pulled upward until the viscous sealing resin 3 is completely separated from the piezoelectric substrate 120 side. In the state shown in FIG. 24 in which the metal mask plate 1 is completely removed, the sealing resin 3 is adhered to the entire outer surfaces of the piezoelectric substrate 120 with a uniform thickness of approximately 0.5 mm.

The piezoelectric substrates 120 with the sealing resin 3 thus adhering thereto, together with the supporting board 102, are moved to a high-temperature furnace at 180° C. or thereabouts to allow the sealing resin 3 to be thermoset and fixed. While this thermosetting, the sealing resin 3 adhering to the piezoelectric substrates 120 is in a stationary state, the sealing resin 3 resumes it original state of high viscosity and maintains its shape. Accordingly, the sealing resin 3 does not droop down along the side surfaces of the piezoelectric substrates 120, and even though it has a thin thickness of 0.5 mm, the sealing resin 3 maintains its shape in the state of covering the entire outer surfaces of the piezoelectric substrates 120.

The piezoelectric substrates 120 sealed by the thermoset sealing resin 3 is not brought into contact with the outside air, its deterioration due to a secular change is prevented, and their electrodes are covered with the insulating sealing resin 3. Therefore, there is no possibility of short-circuiting with other objects. In addition, the part 3*a* of the sealing resin 3 which leaked along the surface of the supporting board 102 around the piezoelectric substrates 120 is pulled off the supporting board 102 as it is adhering to the inner surfaces of the relief recess 7 of the metal mask plate 1. Therefore, this part 3*a* of the sealing resin 3 does not adhere to the region where the operating area 100A has been set, so that its transparency is not impaired. Accordingly, the operator is capable of viewing without trouble the display of the display unit such as a liquid-display panel disposed in close proximity to the reverse surface side of the supporting board 102.

Although in the above-described embodiment a description has been given by citing the piezoelectric substrates which are vibrating parts as electronic parts to be resin sealed, the present invention is also applicable to a metal mask plate which is used at the time of resin sealing other types of electronic parts insofar as such electronic parts are mounted on the touch panel.

The present invention is applicable to a metal mask plate in which a sealing resin is adhered to outer surface of an electronic part which is mounted on a touch panel of a touch panel input device by using the screen-printing process.

What is claimed is:

1. A method of resin-sealing a vibrating part of a touch panel input device that includes an operating panel that has an operating area, a touch panel that supports the operating panel, and a vibrating part that is fixed to a portion of the touch panel, which corresponds to a periphery of the operating area, in which an inputting operation is inputted onto the operating area so that the operating panel is vibrated by the vibrating part so as to generate a feeling of the inputting operation, the method comprising:

providing the touch panel that includes the vibrating part;

disposing a metal mask plate, which includes a through hole that accommodates the vibrating part, and is formed at a portion corresponding to the vibrating part, so as to form a resin inflow space between the vibrating part and the through hole, onto a surface of the touch panel, on which the vibrating part is mounted;

sliding a squeegee over the metal mask plate, so as to fill a sealing resin, which has thixotropic properties, thermosetting properties and insulating properties, in the resin inflow space through the through hole;

removing the metal mask plate from the touch panel; and thermally setting the sealing resin that is deposited on an outer surface of the vibrating part.

2. The method of resin-sealing according to claim 1, wherein the through hole is larger than the vibrating part in height in a direction perpendicular to the metal mask plate.

3. The method of resin-sealing according to claim 1, wherein a portion of the through hole of the touch panel side is smaller than a portion of the through hole, which communicates with and is opposed to the portion of the through hole of the touch panel side, in width in a direction parallel to the metal mask plate, so that the through hole forms a step portion.

4. A screen-printing metal mask plate configuration comprising:

a metal mask plate configuration body, wherein the metal mask plate configuration body faces to a surface of a board, on which an electronic part is mounted, wherein the metal mask plate configuration body includes a through hole that accommodates the electronic part, and is formed at a portion corresponding to the electronic part, wherein the through hole is larger than the electronic part in height in a direction perpendicular to the metal mask plate configuration body, wherein the through hole includes a smaller through hole and a larger through hole that has a contour that includes a contour of the smaller through hole, and communicates with the smaller through hole, so that the through hole forms a step portion, and wherein the contour of the smaller through hole is spaced from the electronic part by a gap corresponding to a thickness of a sealing resin that is to be deposited on the electronic part.

5. The screen-printing metal mask plate configuration according to claim 4, wherein the metal mask plate configuration body includes a first metal mask plate configuration body that faces to the board, and includes the smaller through hole that is formed at a portion corresponding to the electronic part, and a second metal mask plate configuration body that is laminated on a surface of the first metal mask plate configuration body, which is opposed to the board, and includes the larger through hole that communicates with the smaller through hole.

6. The screen-printing metal mask plate configuration according to claim 4, wherein the board includes a touch panel and the electronic part includes a piezoelectric substrate, and wherein an inputting operation is inputted on the touch panel so that the inputting operation is detected and the touch panel is vibrated by the piezoelectric substrate.

7. A metal mask plate configuration for manufacturing a touch panel input device that includes an operating panel that has a transparent operating area, a touch panel that supports the operating panel, and an electronic part that is fixed to a portion of the touch panel, which corresponds to a periphery of the operating area, in which an inputting operation is inputted onto the operating area so that the inputting operating is detected by the electronic part, the metal mask plate configuration comprising:

a metal mask plate configuration body, wherein the metal mask plate configuration body faces to a surface of the touch panel, on which the electronic part is mounted, wherein the metal mask plate configuration body includes a through hole that accommodates the electronic part, and is formed at a portion corresponding to the electronic part, wherein the metal mask plate configuration body includes a relief recess that covers the operating area, is formed at a portion that faces to the touch panel and corresponds to the operating area.

8. The metal mask plate configuration according to claim 7, wherein the electronic part includes a piezoelectric substrate, and wherein the inputting operation is inputted on the touch panel so that the touch panel is vibrated by the piezoelectric substrate.

* * * * *